United States Patent
Fulford et al.

(10) Patent No.: US 12,176,249 B2
(45) Date of Patent: Dec. 24, 2024

(54) 3D NANO SHEET METHOD USING 2D MATERIAL INTEGRATED WITH CONDUCTIVE OXIDE FOR HIGH PERFORMANCE DEVICES

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 383 days.

(21) Appl. No.: 17/667,390

(22) Filed: Feb. 8, 2022

(65) Prior Publication Data
US 2023/0253261 A1 Aug. 10, 2023

(51) Int. Cl.
*H01L 21/8238* (2006.01)
*H01L 27/092* (2006.01)
*H01L 29/786* (2006.01)

(52) U.S. Cl.
CPC ........ *H01L 21/823821* (2013.01); *H01L 21/823814* (2013.01); *H01L 27/0924* (2013.01); *H01L 29/78696* (2013.01)

(58) Field of Classification Search
CPC ..... H01L 21/823821; H01L 21/823814; H01L 27/0924; H01L 29/78696; H01L 29/0657; H01L 29/66969; H01L 29/778; H01L 29/0673; H01L 29/66439; H01L 29/775; H01L 29/7869; H01L 21/8256; H01L 27/088; H01L 29/1606; H01L 29/24; H01L 29/42392; H01L 27/092; H01L 27/0688; B82Y 10/00
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2022/0165732 A1* | 5/2022 | Khaderbad | H01L 29/7606 |
| 2022/0328670 A1* | 10/2022 | Lee | H01L 29/1606 |

(Continued)

*Primary Examiner* — Karen Kusumakar
*Assistant Examiner* — Adam S Bowen
(74) *Attorney, Agent, or Firm* — Foley & Lardner LLP

(57) ABSTRACT

Methods for the manufacture of semiconductor devices constructed with two-dimensional (2D) materials and conductive oxides using three-dimensional (3D) nanosheets are disclosed. Aspects can include forming the stack of layers comprising a first layer of a semiconductive-behaving material separated from a base layer by a first layer of a first dielectric material and a first layer of a second dielectric material; a second layer of the semiconductive-behaving material separated from the first layer of the semiconductive-behaving material by a second layer of the second dielectric material; and a second layer of the second dielectric material formed on the second layer of the semiconductive-behaving material. Aspects include forming a metal contact coupled with the semiconductive-behaving material, forming a 2D material on the semiconductive-behaving material, forming a layer of a high-k dielectric material on the 2D material, and forming a gate metal on the high-k dielectric material.

19 Claims, 23 Drawing Sheets

(56) References Cited

U.S. PATENT DOCUMENTS

| | | | |
|---|---|---|---|
| 2023/0098467 A1* | 3/2023 | Naylor | H01L 21/02502 |
| | | | 257/29 |
| 2023/0099814 A1* | 3/2023 | Maxey | H01L 29/66969 |
| | | | 257/29 |
| 2023/0113614 A1* | 4/2023 | O'Brien | H01L 29/42392 |
| | | | 257/288 |

* cited by examiner

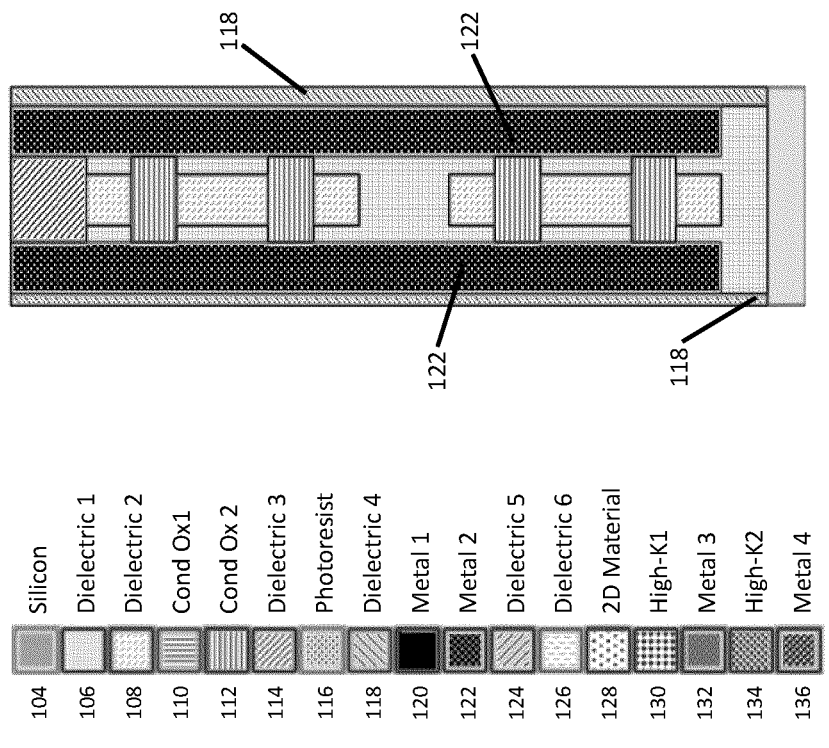
FIG. 6
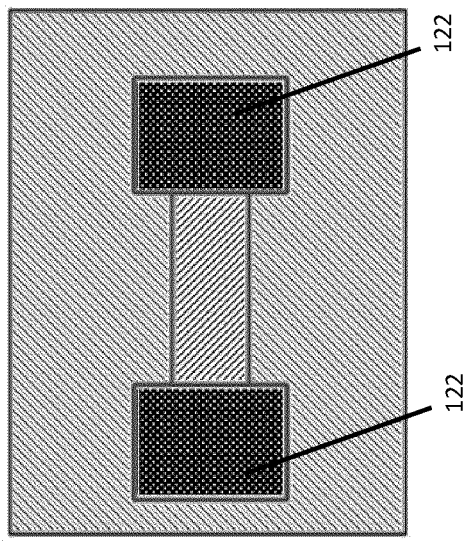

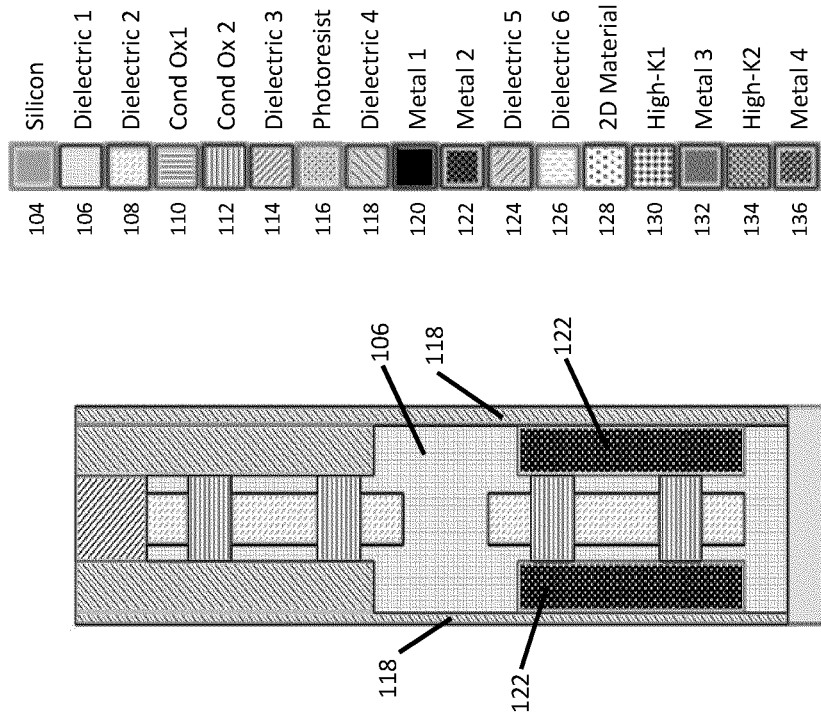
FIG. 7
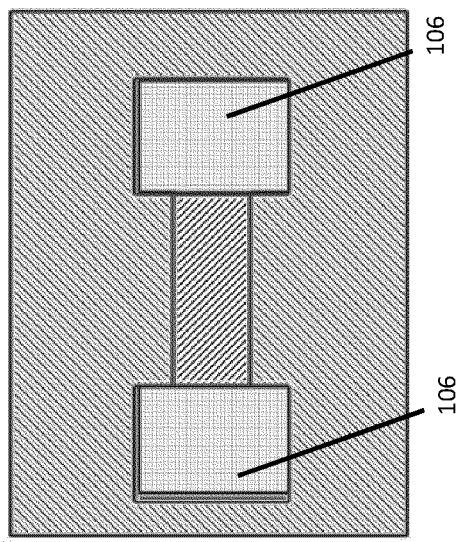

3D NANO SHEET METHOD USING 2D MATERIAL INTEGRATED WITH CONDUCTIVE OXIDE FOR HIGH PERFORMANCE DEVICES

TECHNICAL FIELD

The present invention relates generally to the field of manufacturing semiconductor devices.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional micro microfabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators have expressed a desire for semiconductor circuits in which transistors have increased complexity and dimensionality.

SUMMARY

A variety of semiconductor devices that integrate 2D materials are proposed, which aim to overcome scaling limitations experienced in planar devices by increasing transistor density in volume rather than area. The devices and methods may utilize nanosheet masks to form openings in stacks of layers, allowing for precise deposition or formation of 2D materials and other semiconductor materials. Such 2D materials have the potential for very high mobility, and therefore enable sub-nanometer channel thickness regions. Such techniques can enable future nanoscale transistors which may be implemented in a variety of logical circuits, including central processing units (CPUs), graphics processing units (GPUs), and field-programmable gate arrays (FPGAs).

In one embodiment, a method may comprise forming a stack of layers comprising: a first layer of a semiconductive-behaving material; and a second layer of the semiconductive-behaving material separated from the first layer of the semiconductive-behaving material by a dielectric material. The method may also include forming a metal contact coupled to both the first layer of the semiconductive-behaving material and the second layer of the semiconductive-behaving material; forming a two-dimensional (2D) material on the first layer of the semiconductive-behaving material; forming the 2D material on the second layer of the semiconductive-behaving material; forming a high-k dielectric material on the 2D material on the first layer of the semiconductive-behaving material; forming the high-k dielectric material on the 2D material on the second layer of the semiconductive-behaving material; and forming a gate metal on the high-k dielectric material.

The method may further comprise etching a first opening at a first side of the stack of layers and a second opening at the second side of the stack of layers; and recessing the dielectric material via the first opening and the second opening to create one or more recessed openings. Forming the metal contact may further comprise forming a second dielectric material in the first opening, the second opening, and the one or more recessed openings; and replacing a portion of the second dielectric material with the metal contact.

The semiconductive-behaving material may be one of an n-type material or a p-type material.

The method may further comprise forming a second stack of layers comprising: a third layer of a second semiconductive-behaving material; and a fourth layer of the second semiconductive-behaving material separated from the third layer of the second semiconductive-behaving material by a dielectric material; forming a second metal contact coupled to both the third layer of the second semiconductive-behaving material and the fourth layer of the second semiconductive-behaving material; forming a second 2D material on the third layer of the second semiconductive-behaving material; forming the second 2D material on the fourth layer of the second semiconductive-behaving material; forming a second high-k dielectric material on the second 2D material; and forming a second gate metal on the second high-k dielectric material.

The second semiconductive-behaving material and the first semiconductive-behaving material may be the same material; the second metal contact and the first metal contact may be the same material; the second 2D material and the first 2D material may be the same material; and the second gate metal and the first gate metal may be the same material.

The second semiconductive-behaving material and the first semiconductive-behaving material may be different materials; the second metal contact and the first metal contact may be different materials; the second 2D material and the first 2D material may be different materials; and the second gate metal and the first gate metal may be different materials.

Forming the metal contact may comprise selectively forming the metal contact on the semiconductive-behaving material. Forming the 2D material may comprise selectively depositing the 2D material on the semiconductive-behaving material. Forming the high-k dielectric material may comprise selectively depositing the high-k dielectric material on the 2D material.

In another embodiment, a device may comprise a transistor structure comprising: a layer of a semiconductive-behaving material partially surrounded by a two-dimensional (2D) material, a high-k dielectric material, and a gate metal; a first metal contact coupled to a first surface of the semiconductive-behaving material, and electrically isolated from the 2D material, the high-k dielectric material, and the gate metal, the first and second metal contacts electrically isolated by a dielectric layer disposed between the first metal contact and the metal gate, the 2D material and the high-k dielectric material, the dielectric layer extending at least partially around the first and second metal contacts; and a second metal contact coupled to a second surface of the semiconductive-behaving material, and electrically isolated from the 2D material, the high-k dielectric material, and the gate metal.

The device may further comprise a second transistor structure formed above the transistor structure, the second transistor structure comprising: a layer of a second semiconductive-behaving material partially surrounded by a second 2D material, a second high-k dielectric material, and a second gate metal; a third metal contact coupled to a first surface of the second semiconductive-behaving material, and electrically isolated from the second 2D material, the second high-k dielectric material, and the second gate metal; and a fourth metal contact coupled to a second surface of the second semiconductive-behaving material, and electrically isolated from the second 2D material, the second high-k dielectric material, and the second gate metal.

The second semiconductive-behaving material and the first semiconductive-behaving material may be the same material; the third metal contact and the first metal contact may be the same material; the second 2D material and the first 2D material may be the same material; the second high-k dielectric material and the first high-k dielectric material may be the same material; and the second gate metal and the first gate metal may be the same material.

The second semiconductive-behaving material and the first semiconductive-behaving material may be different materials; the third metal contact and the first metal contact may be different materials; the second 2D material and the first 2D material may be different materials; the second high-k dielectric material and the first high-k dielectric material may be different materials; and the second gate metal and the first gate metal may be different materials.

The second metal contact may be coupled to the metal contact. The second gate metal may be coupled to the gate metal.

The transistor structure may further comprise a second layer of the semiconductive-behaving material partially surrounded by the 2D material, the high-k dielectric material, and the gate metal, wherein the first metal contact is coupled to a first surface of the second layer of the semiconductive-behaving material, and electrically isolated from the 2D material, the high-k dielectric material, and the gate metal, and the second metal contact is coupled to a second surface of the second layer of the semiconductive-behaving material, and electrically isolated from the 2D material, the high-k dielectric material, and the gate metal.

In yet another embodiment, a transistor structure may comprise a source metal; a drain metal; a channel of a semiconductive behaving material extending between the source metal and the drain metal; a two-dimensional (2D) material partially around the channel; a high-k dielectric at least partially around the 2D material; and a gate metal at least partially around the high k-dielectric, wherein the 2D material, high-k dielectric, and gate metal are isolated from the source metal and drain metal by a dielectric.

The transistor structure may include a second channel of the semiconductive-behaving material extending between the source metal and the drain metal, wherein the 2D material is partially around the second channel, the high-k dielectric is partially around the 2D material, and the gate metal is partially around the high k-dielectric.

The transistor structure may include a second channel of the semiconductive-behaving material extending between a second source metal and a second drain metal, wherein the 2D material is partially around the second channel, the high-k dielectric is partially around the 2D material, and the gate metal is partially around the high k-dielectric.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 1-13 show various views of a first process flow to manufacture semiconductor devices using 3D nanosheets and 2D materials, according to an embodiment;

DETAILED DESCRIPTION

Figure 1:
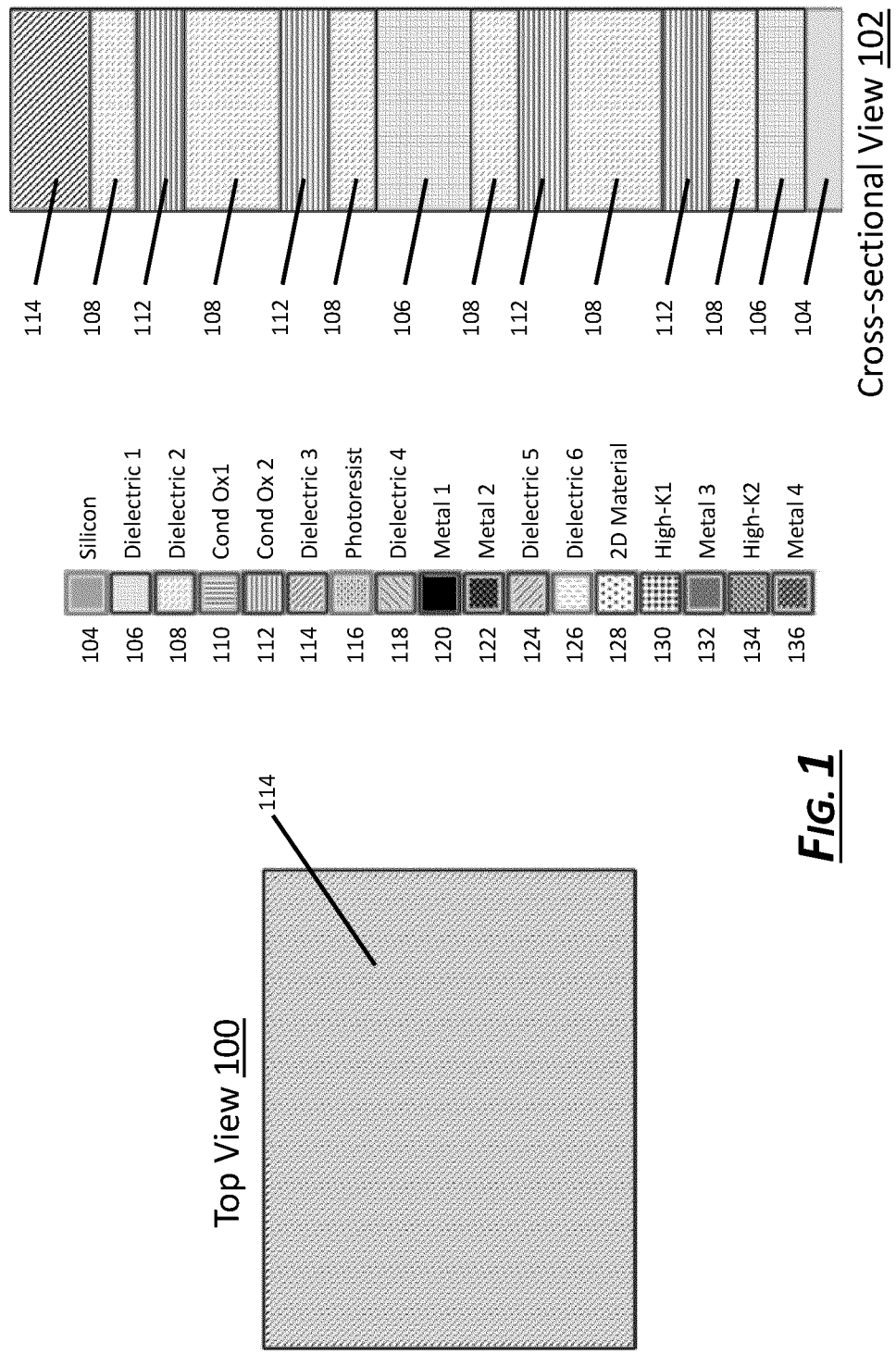

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein enable the formation of conductor devices made from 2D materials using 3D nanosheet. The present techniques include providing 2D materials in conjunction with conductive oxides as an under layer in transistor devices. The use of a conductive under layer can provide improved connections between the sources and drains of the transistor devices. Because the 2D material has a significant boost in performance relative to other semiconductive materials, such as silicon, the present techniques provide devices having improved performance compared to conventional semiconductor devices. Additionally, a base substrate of silicon is not required to perform the techniques described herein, allowing the present devices to be formed on any suitable surface or base layer. This also allows for increased 3D stacking of semiconductor devices and allows for a stack of N devices, rather than conventional single-layer devices. The present techniques can be used to create any type of semiconductive device, including NMOS devices, PMOS devices, and CFET devices. The techniques described herein may be implemented utilizing pre-aligned masks to improve etching various layers or openings during device fabrication.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative, and are intended to show a capability for providing such connections, and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIGS. 1-13 show various views of a first process flow to manufacture semiconductor devices using 3D nanosheets and 2D materials. Each of the FIGS. 1-13 generally refer to one or more process steps in a process flow, each of which are described in detail in connection with a respective Figure. For the purposes of simplicity and ease of visualization, some reference numbers may be omitted from some Figures. Referring to FIG. 1, illustrated is a top view 100 and a cross-sectional view 102 of the stack of layers. At the start of the process flow, a stack of layers can be formed, as shown. The stack of layers may be formed on a base layer 104 (shown as "Silicon" in the legend), which may be any type of base material, including other stacks of layers formed using processes similar to those described herein. To form the stack of layers, a first layer of dielectric material 106 (shown in the legend as the "Dielectric 1") is formed on the base layer 104, and a first layer of a second dielectric material 108 (shown as "Dielectric 2" in the legend) is formed on top of the layer of dielectric material 106. The layers may be formed using any suitable material deposition or formation technique, including, for example, atomic layer deposition (ALD), chemical vapor deposition (CVD), physical vapor deposition (PVD), plasma-enhanced CVD (PECVD), or epitaxial growth, among others.

| As used herein, the terms "first," "second," "third," and "fourth" with respect to particular layers of the stack shown in FIGS. 1-13 refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. The dielectric material 106 and the second dielectric material 108 can be any type of dielectric material, including but not limited to oxide materials. The dielectric material 106 and the second dielectric material 108 can operate as electric insulators. A layer of a first semiconductive-behaving material 112 (shown in the legend as "Cond Ox 2") can be formed on the second dielectric material 108. The semiconductive-behaving material can be, for example, conductive oxide materials (sometimes referred to herein as "conductive channels" or "conductive oxides"), which may have similar properties to semiconductor materials. Certain materials, when combined with oxygen, may form new materials that exhibit semiconductor properties (e.g., features formed with the materials can turn "off" with low off-state leakage current, or can become highly conductive under certain circumstances, etc.). Some examples of N-type conductive oxides include $In_2O_3$, $SnO_2$, InGaZnO, and ZnO. One example of a P-type conductive oxide is SnO. One example of a P-type conductive channel is SnO.

A second layer of the second dielectric material 108 can then be formed on the first layer of the semiconductive-behaving material 112. A second layer of the semiconductive behaving material 112 can then be formed on the second layer of the second dielectric material 108. A third layer of the second dielectric material 108 can then be formed on top of the second layer of the semiconductive behaving material, thereby creating two layers of semiconductive-behaving material 112 sandwiched between layers of the second dielectric material 108. Additional layers of semiconductive behaving material can be added to form additional transistor structures in the stack of materials. As shown in the cross-sectional view 102, a third and fourth layer of the semiconductive behaving materials 112 are formed between layers of the second dielectric material 108. This stack of additional semiconductive-behaving materials 112 and the second dielectric materials can be formed on top of a layer of the first dielectric material 106, which itself is formed on the third layer of the second dielectric material 108, as shown. Once the desired number of layers of the semiconductive-behaving material 112 have been formed, a top layer of a third dielectric material 114 can be formed using a suitable material deposition technique.

Figure 2:
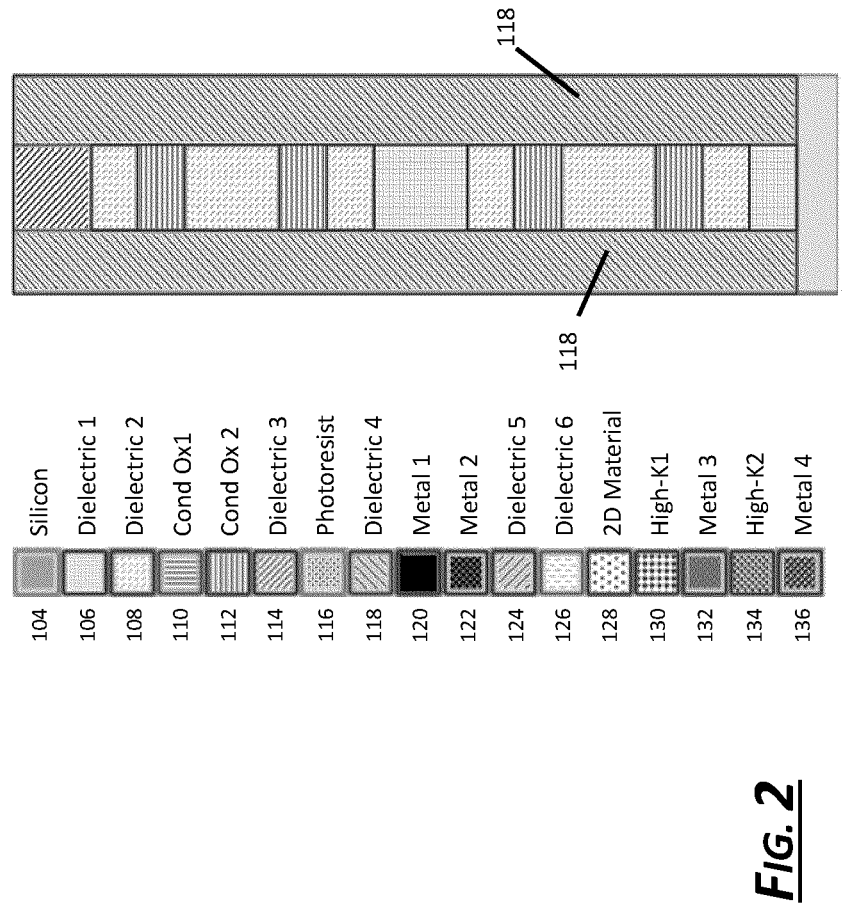
Figure 2:
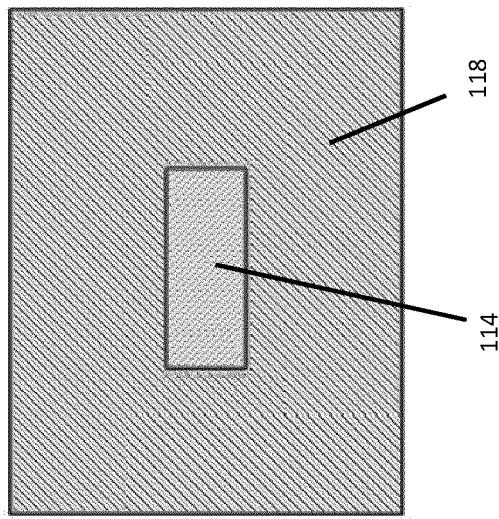

Referring to FIG. 2, illustrated are a top view 200 and a cross-sectional view 202 of the next stage in the process flow. At this stage in the process flow, the stack of layers formed on the base layer 104 can be etched to a desired width and length, as shown in the top view 200. Although the stack of layers has been etched in a rectangle shape, it should be understood that the stack of layers can be formed in any desired geometry. The width or length can be chosen based on desired electrical characteristics of the device. Any suitable etching or material removal technique can be used, including but not limited to dry etching, wet etching, or plasma etching techniques, among others. A nanosheet mask may be used to pattern the stack of layers. The etching process may have an etch stop at the base layer 104. After etching the stack of layers, a fourth dielectric material 118 can be deposited to surround the stack of layers using any suitable material deposition technique, as shown in the top view 200 and the cross-sectional view 202. While the FIGS. illustrate a single defined device area for the sake of simplicity, this area may be surrounded by an insulating material and may be one of many such structures spanning in the x— and y-directions, insulated from each other by layer 118.

Figure 3:
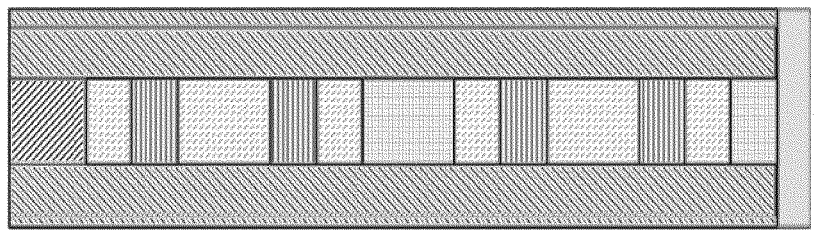
Figure 3:
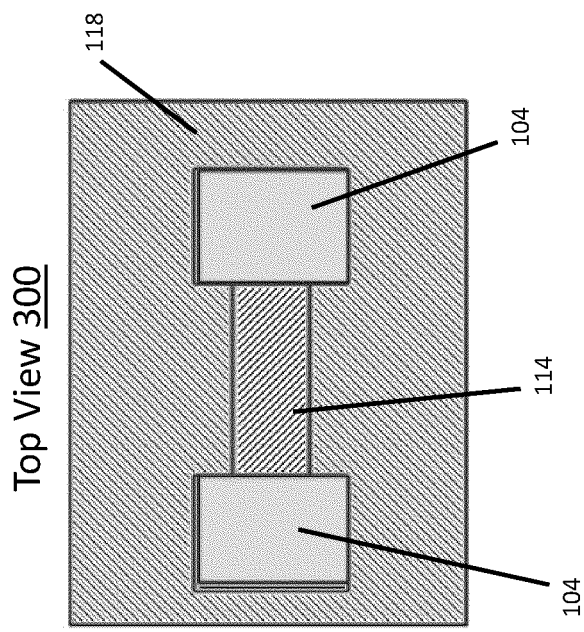

Referring to FIG. 3, illustrated are a top view 300 and a cross-sectional view 302 of the next stage in the process flow. At this stage in the process flow, one or more openings can be formed through the fourth dielectric material 118, adjacent to one or more corresponding sides of the now-etched stack of layers. The openings can define the regions that will be occupied by metal contacts that form the source/drain of one or more transistor structures formed using the present techniques. The openings can be defined using a nanosheet mask over the top of the fourth dielectric material 118. Any suitable etching or material removal technique can be used, including but not limited to dry etching, wet etching, or plasma etching techniques, among others. Although two openings are shown here, it should be understood that any number of openings can be formed through the fourth dielectric material 118 for use in further process steps.

Figure 4:
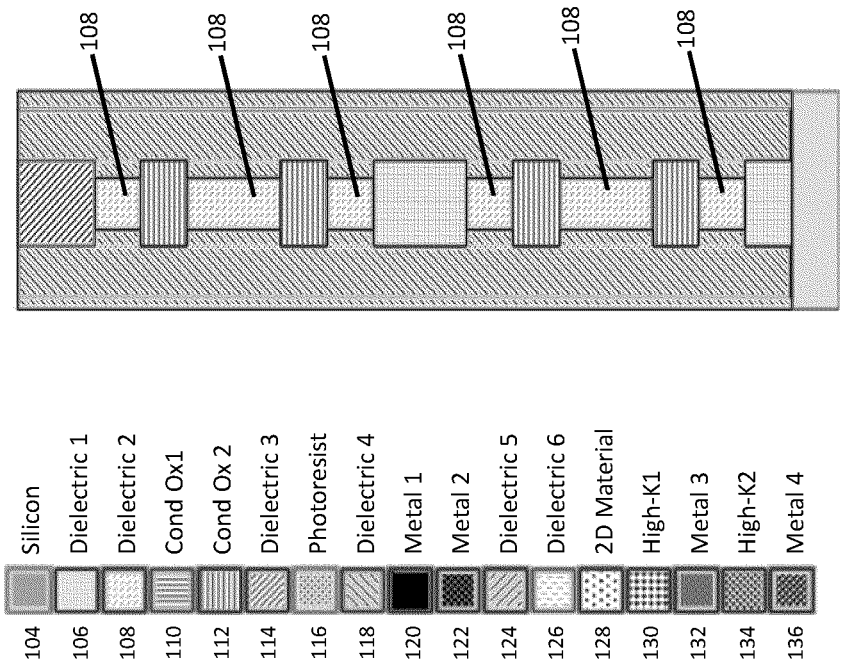
Figure 4:
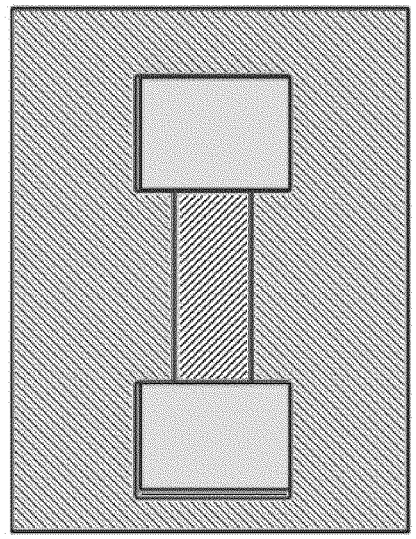

Referring to FIG. 4, illustrated are a top view 400 and a cross-sectional view 402 of the next stage in the process flow. At this stage in the process flow, the second dielectric material 108 can be etched partially via the openings formed in the previous stage. The etching process used is considered a recess etch and may be a selective etching process, which leaves the other layers and other materials shown in FIG. 4 intact while partially etching the second dielectric material 108. However, in some implementations, a protective layer may be selectively deposited over the other layers in the stack of layers to protect those layers from the etching process used to recess the second dielectric material 108. The protective layer can then be removed prior to performing further process steps. Etching the second dielectric material can create one or more recessed air gaps in the regions previously occupied by the second dielectric material 108. The new length (e.g., from left to right in the cross-sectional view 402) of the second dielectric material 108 can define the length of the gate materials when formed in layer process steps. Therefore, etching the second dielectric material 108 in this manner can isolate metal contacts for the source/drain from the gate metal, as will be described in greater detail herein.

Figure 5:
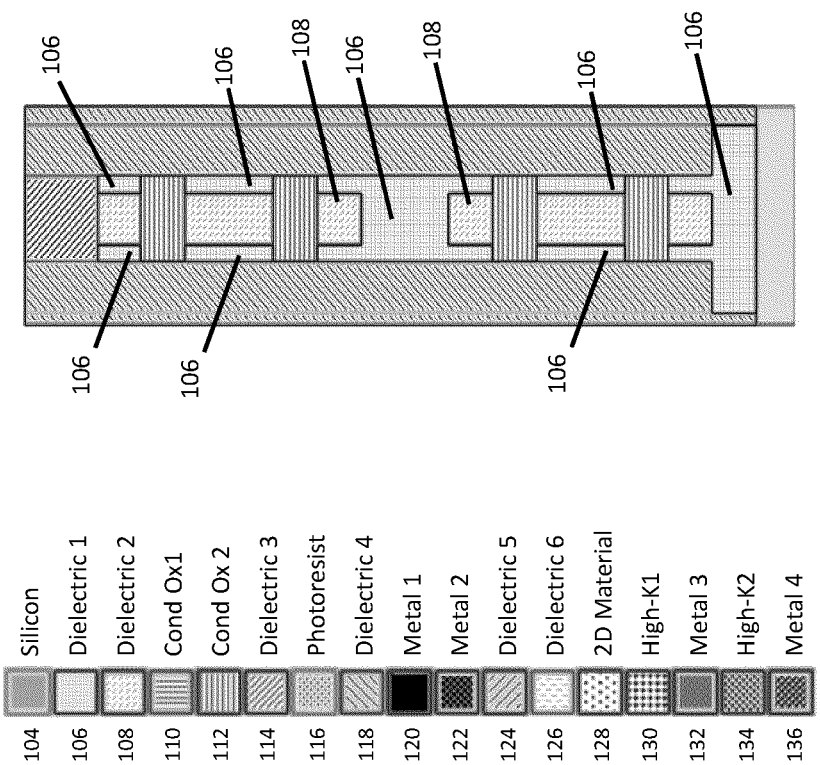
Figure 5:
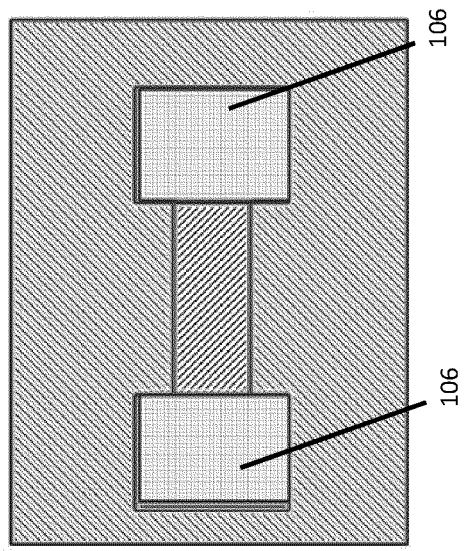

Referring to FIG. 5, illustrated is a top view 500 and a cross-sectional view 502 of the next stage in the process flow. At this stage in the process flow, the openings etched through the fourth dielectric material 118 and the recessed air gaps formed by etching the second dielectric material 108 can be deposit-filled with the first dielectric material 106. In some implementations, a chemical-mechanical polish (CMP) process may be performed after depositing the first dielectric material 106. Then, the first dielectric material 106 can be directionally etched until it is level with the bottom of the first layer of the second dielectric material 108, as shown in the cross-sectional view 502. Etching the first dielectric material 106 re-exposes the sides of the stack of layers (including the semiconductive-behaving material 112) in the openings, while isolating the openings from the base layer 104. The first dielectric material 106 is directionally etched such that the recessed air gaps formed when etching the second dielectric material 108 are now filled with the first dielectric material 106. In some implementations, the first dielectric material 106 can be directionally etched such that the base layer 104 is exposed in the openings.

Referring to FIG. 6, illustrated is a top view 600 and a cross-sectional view 602 of the next stage in the process flow. At this stage in the process flow, the openings etched through the fourth dielectric material 118 can be deposit-filled with a metal material 122 (shown in the legend as "Metal 2"). Any suitable material deposition technique may be used to deposit fill the openings with the metal material 122. In some implementations, a chemical-mechanical polish (CMP) process may be performed after depositing the metal material 122. Alternatively, the metal material 122 can be grown on one or more of the materials exposed in the openings. For example, the metal material 122 may be grown on the semiconductive-behaving material 112. If the base layer 104 is exposed, and the base layer 104 is made of a doped silicon material, the metal material 122 may be epitaxially grown on the base layer 104 such that it fills the openings. In some implementations, the metal material 122 may be grown on both the semiconductive-behaving material 112 and the base layer 104.

Referring to FIG. 7, illustrated is a top view 700 and a cross-sectional view 702 of the next stage in the process flow. At this stage in the process flow, the metal material 122 can be directionally etched until it is level with the bottom of the first layer of the second dielectric material 108, as shown in the cross-sectional view 702. Etching the metal material 122 can allow two bottom transistor structures formed in later process steps to be electrically isolated from two top transistors formed in later process steps. However, it should be understood that alternative approaches are also possible. For example, the metal material 122 may be etched such that it contacts only one layer of the semiconductive-behaving material 112. Then, a layer of dielectric may be deposited and etched, and another layer of the metal 122 may be deposited to contact the second layer of the semiconductive-behaving material 122. This approach allows for each transistor structure to be isolated from one another. The metal material 122 can be etched to cover the entirety of the second layer of the semiconductive-behaving material 112, as shown in the cross-sectional view 702. After etching the metal material 122, the openings can then be deposit-filled with the first dielectric material 106. In some implementations, a chemical-mechanical polish (CMP) process may be performed after depositing the first dielectric material 106. Then, the first dielectric material 106 can be directionally etched until it just exposes the entirety of the third layer of the semiconductive-behaving material 112, as shown in the cross-sectional view 702. Etching the first dielectric material 106 therefore re-exposes the sides the top two layers of the semiconductive-behaving material 112 while isolating the openings from the base layer 104.

Figure 8:
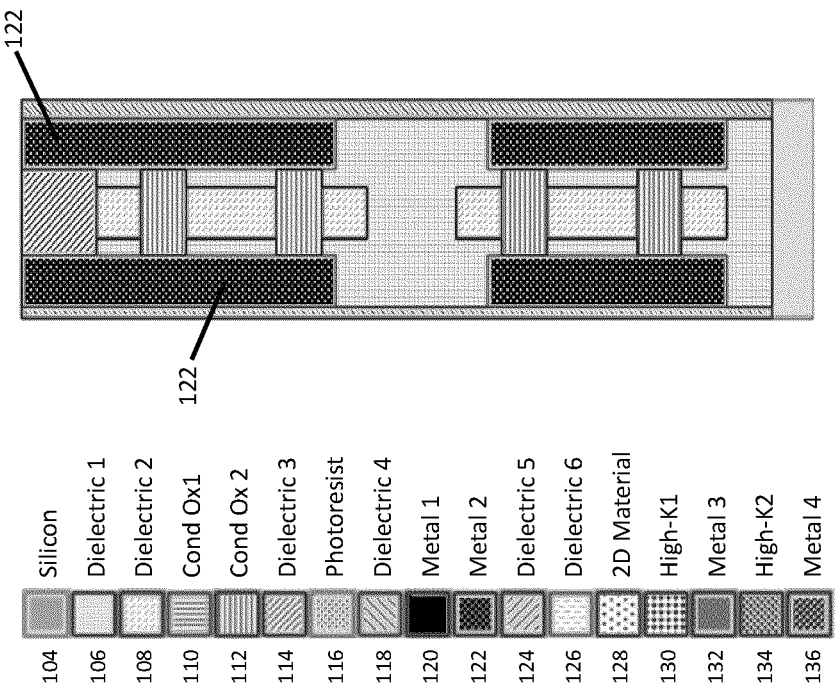
Figure 8:
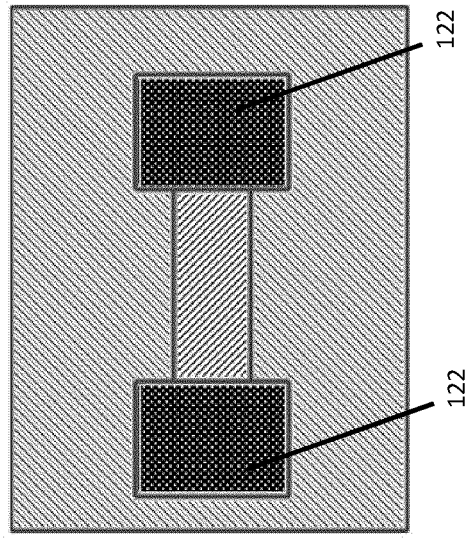

Referring to FIG. 8, illustrated is a top view 800 and a cross-sectional view 802 of the next stage in the process flow. At this stage in the process flow, the openings above the now-etched first dielectric material 106 can be deposit-filled with the metal material 122. Any suitable material deposition technique may be used to deposit fill the openings with the metal material 122. In some implementations, a CMP process may be performed after depositing the metal material 122. Alternatively, the metal material 122 can be grown on one or more of the materials exposed in the openings. For example, the metal material 122 may be grown on the semiconductive-behaving material 112.

Figure 9:
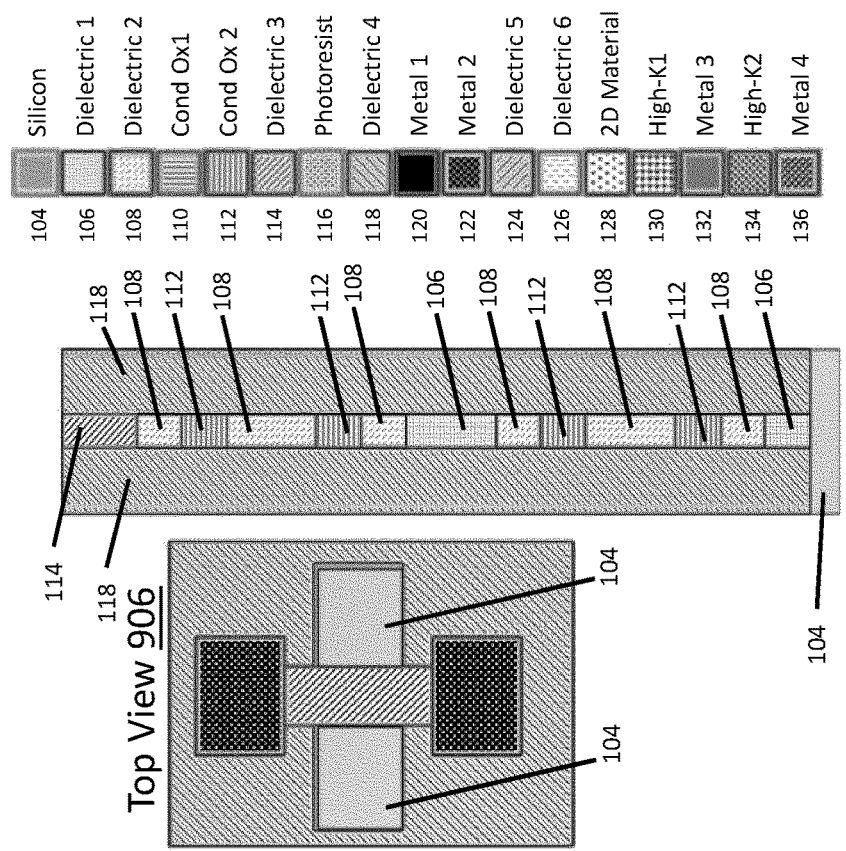

Referring to FIG. 9, illustrated are top views 900 and 906 and cross-sectional views 902 and 904 of the next stage in the process flow. At this stage in the process flow, one or more gate openings can be formed through the fourth dielectric material 118, adjacent to one or more corresponding sides of the stack of layers, different from the sides adjacent to the openings that were used to form the source/drain contacts with the metal material 122. The gate openings can define the regions that will be occupied by the gate materials, including the gate metals, gate dielectric materials, and other materials, for transistor structures formed using the present techniques. The length of the gate openings can match the length of the second dielectric material 108. The gate openings can be defined using a nanosheet mask over the top of the fourth dielectric material 118. Any suitable etching or material removal technique can be used, including but not limited to dry etching, wet etching, or plasma etching techniques, among others, to etch the fourth dielectric material 118.

Figure 10:
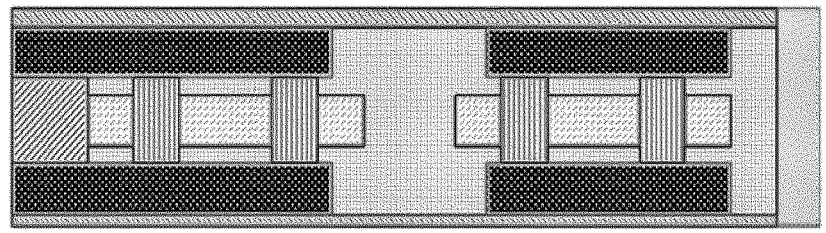
Figure 10:
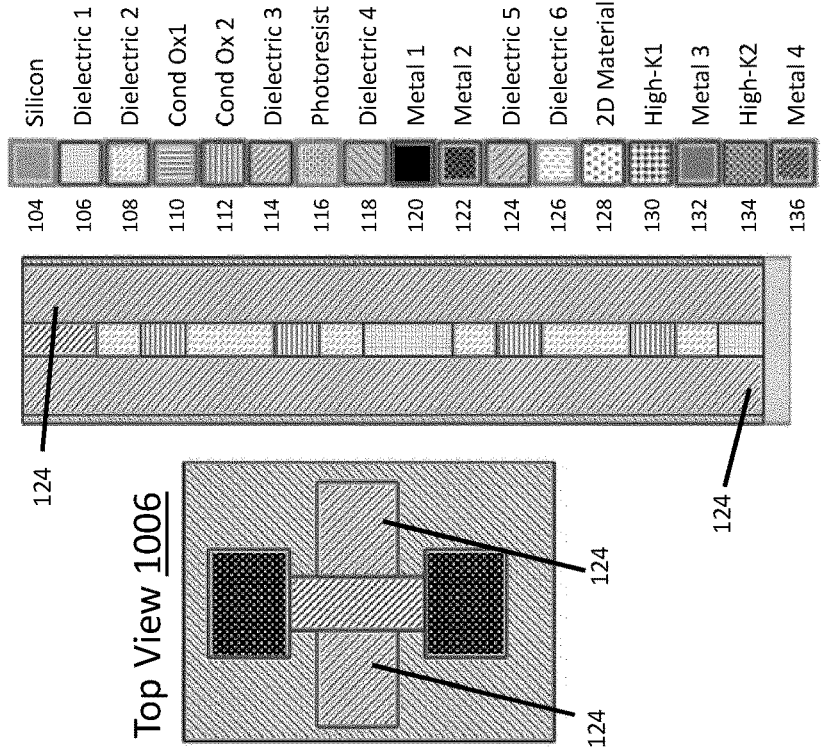

Referring to FIG. 10, illustrated are top views 1000 and 1006 and cross-sectional views 1002 and 1004 of the next stage in the process flow. At this stage in the process flow, the gate openings etched through the fourth dielectric material 118 can be deposit-filled with a fifth dielectric material 124 (shown in the legend as "Dielectric 5"). In some implementations, a CMP process may be performed after depositing the fifth dielectric material 124. Any suitable material deposition technique can be used to deposit the fifth dielectric material 124, including ALD, CVD, PVD, or PECVD, among others. Depositing the fifth dielectric material 124 can protect the gate region and form a dummy (or placeholder) material where a gate will later be formed.

Figure 11:
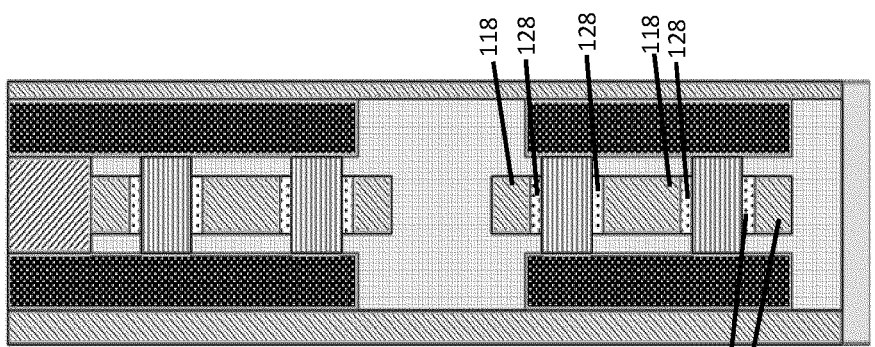
Figure 11:
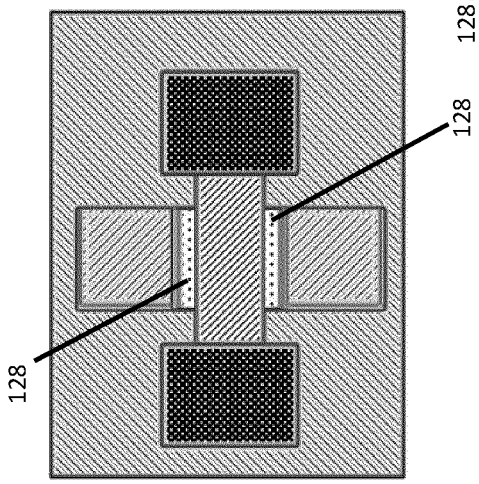
Figure 11:
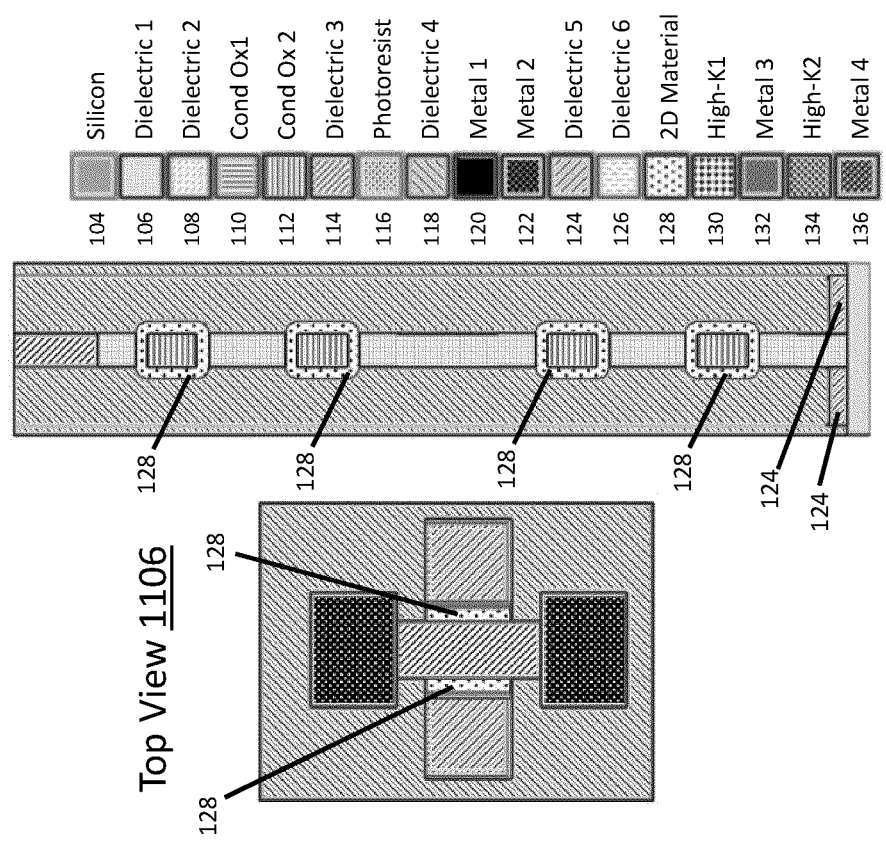

Referring to FIG. 11, illustrated are top views 1100 and 1106 and cross-sectional views 1102 and 1104 of the next stage in the process flow. At this stage in the process flow, the fifth dielectric material 106 can be directionally etched until all layers of the semiconductive-behaving material 122 are exposed in the gate openings. The fifth dielectric material 124 can be etched such that the base layer 104 is not exposed in the gate openings, effectively isolating the base layer 104 from any gate materials. Additionally, as shown, the second dielectric material 108 can be removed using an etching process. The semiconductive-behaving materials 112 can be held in place between the columns of the metal material 122 and portions of the fourth dielectric material 118. This allows gate materials, such as gate dielectric materials and gate metal materials, to be formed to completely surround portions of the gate.

After etching both the fifth dielectric material 124 and the second dielectric material 108, a 2D material 128 (shown in the legend as "2D material") can be formed on the semiconductive-behaving material 112. Because the second dielectric material 108 was etched in previous process steps, the 2D material 128 can be formed to surround the layer of the semiconductive-behaving material 112 in the gate openings. The 2D material 128 can be any type of suitable material including transition-metal dichalcogenide (TMD) materials such as $WS_2$, $WSe_2$, $WTe_2$, $MoS_2$, $MoSe_2$, $MoTe_2$, $HfS_2$, $ZrS_2$, $TiS_2$, GaSe, InSe, InGaZrO, graphene or phosphorene, among others. The 2D material 128 can be selectively deposited on the semiconductive-behaving material 112. The 2D material can be deposited using any suitable material deposition technique, including ALD, CVD, PVD, or PECVD, among others. In some implementations, the 2D material 128 can be selectively grown on the semiconductive-behaving material 112, such that the semiconductive-behaving material 112 behaves as a seed material.

Figure 12:
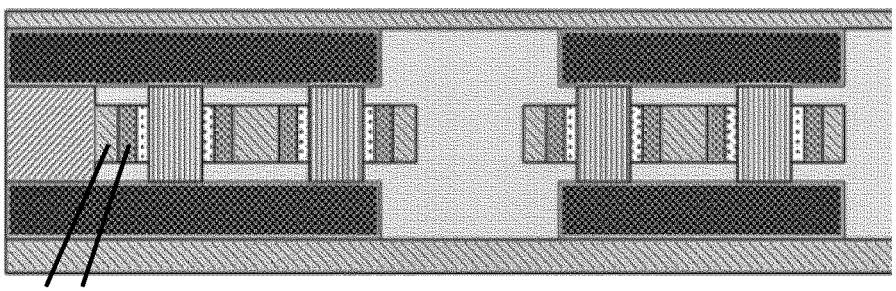
Figure 12:
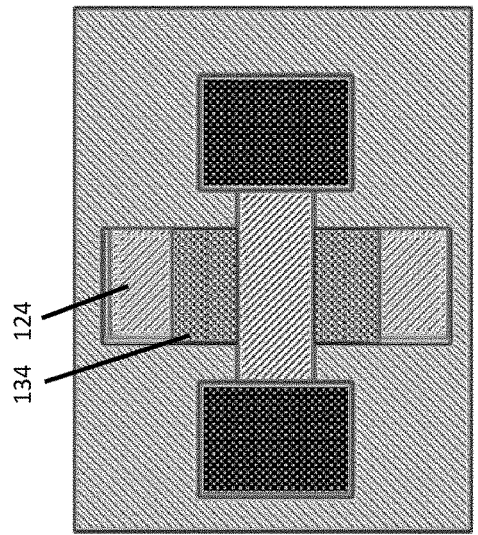
Figure 12:
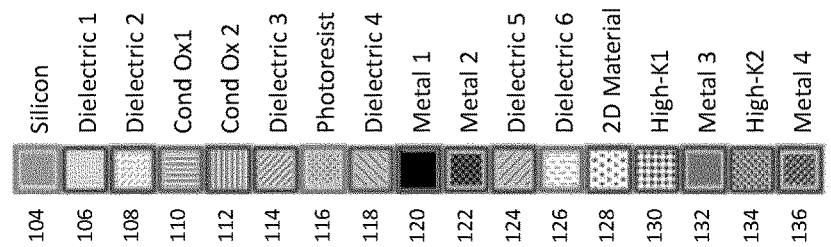
Figure 12:
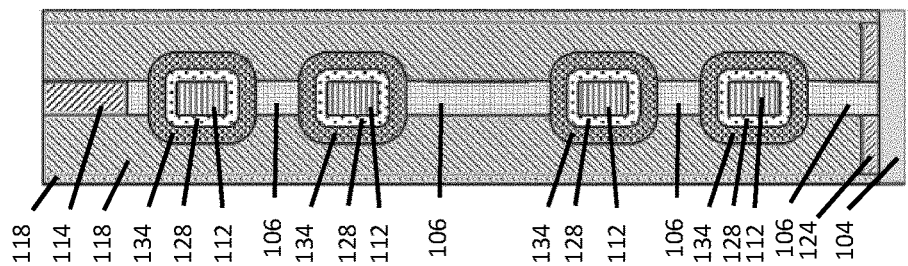

Referring to FIG. 12, illustrated are top views 1200 and 1206 and cross-sectional views 1202 and 1204 of the next stage in the process flow. At this stage in the process flow, a high-k dielectric material 134 (shown as "High-K2" in the legend) can be selectively deposited the 2D material 128 via the gate opening. The high-k dielectric material 134 acts as a gate dielectric material for the channel formed from the 2D material 128 and the semiconductive-behaving material 128, which is defined by the 2D material 128. The high-k dielectric material 134 can be any type of material with a relatively high dielectric constant and may be deposited at a predetermined thickness to achieve a desired capacitance. In some implementations, the high-k dielectric material 134 can be selectively deposited or grown, such that the high-k dielectric is deposited only on the 2D material 128. The high-k dielectric material 134 may be deposited using any suitable material deposition technique, including but not limited to ALD, CVD, PVD, or PECVD, among others.

Figure 13:
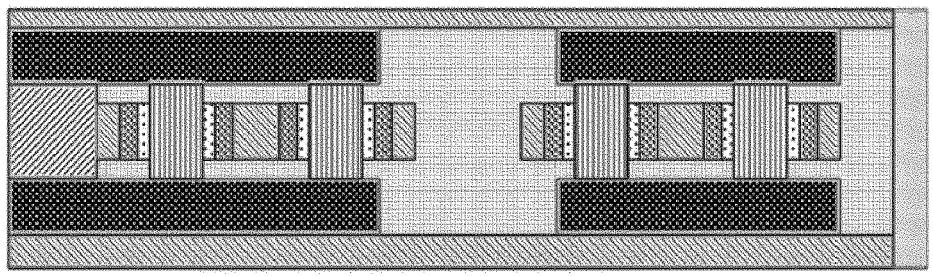
Figure 13:
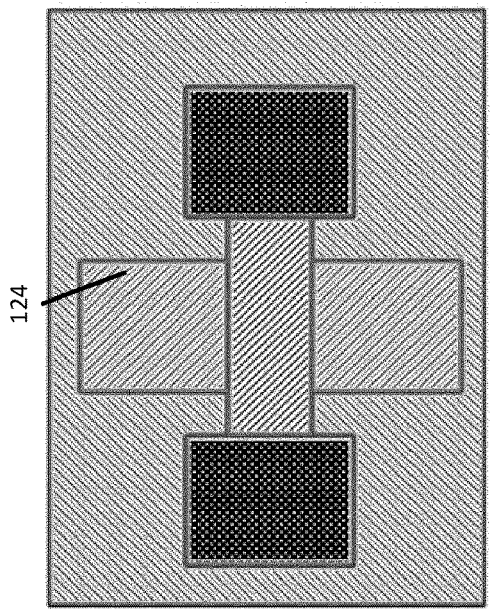
Figure 13:
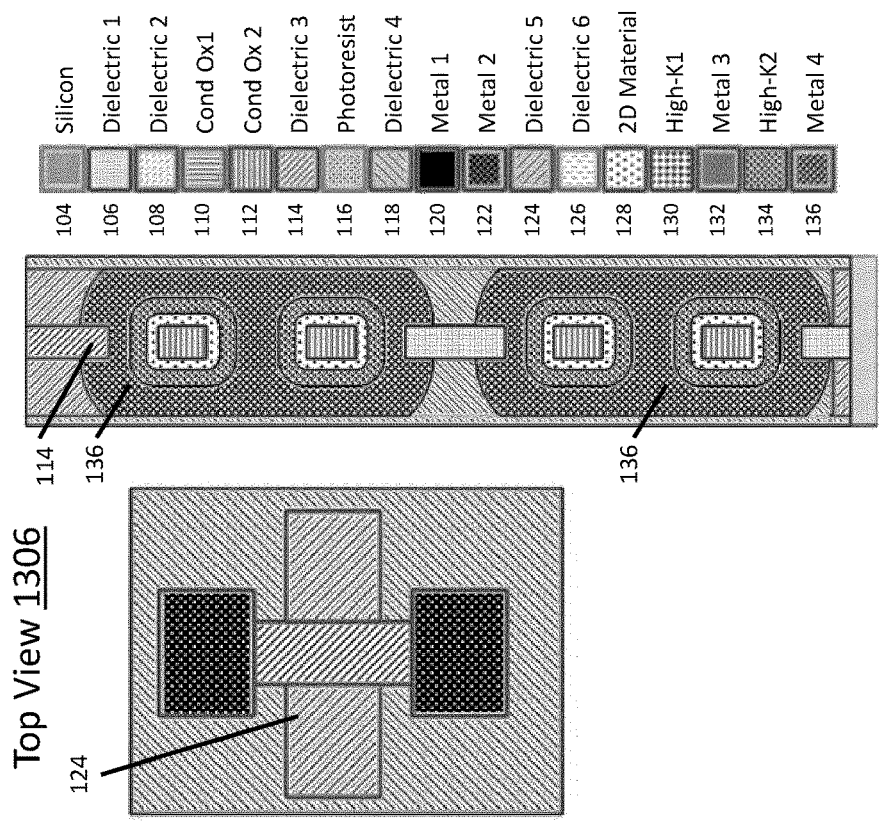

Referring to FIG. 13, illustrated are top views 1300 and 1306 and cross-sectional views 1302 and 1304 of the next stage in the process flow. At this stage in the process flow, a gate metal 136 can be selectively formed on the high-k dielectric material 134. The gate metal 136 may be deposited using any suitable material deposition technique, including but not limited to ALD, CVD, PVD, or PECVD, among others. In some implementations, the gate metal 136 may be grown on the high-k dielectric material 134, such that the high-k dielectric material 134 behaves as a seed material for the gate metal 136. As shown, two regions of the gate metal 136 can be formed, each of which surround the pair of bottom and the pair of top transistor structures. In this particular configuration shown in cross-sectional view 1304, the gate metal 136 is shaped like a numeral "8," whereby the gate metal 136 is rectangular, rectangular with curved ends, or stadium-shaped, and the gate metal 136 has two apertures filed by the conductive oxide channel, 2D material, and high-k dielectric. Although the gate metal 136 is shown here as completely surrounding both bottom transistor structures, it should be understood that temporary dielectric layers, etching, or other techniques may be used to isolate the gate metal 136 for each transistor from one another. As shown in the cross-sectional view 1304, there remains an air gap between the bottom region of the gate metal 136 and the top region of the gate metal 136. Once the gate metal 136 is selectively deposited on the high-k dielectric material 134, the fifth dielectric material 124 can be deposited to fill the remaining space at the top of the gap openings. After depositing the fifth dielectric material 124, a CMP process can be performed.

Figure 14:
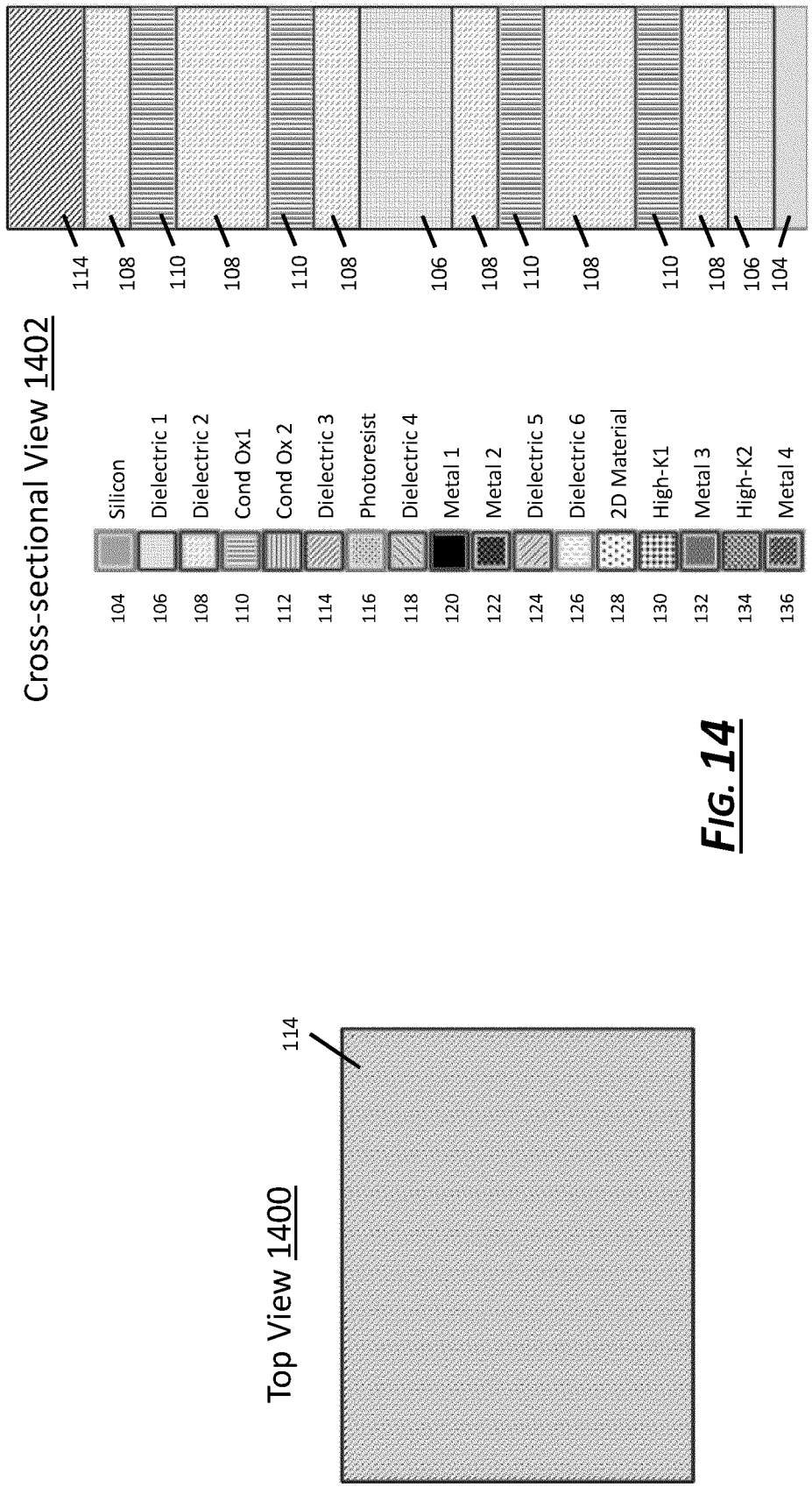
FIGS. 14-16 show various views of a second process flow to manufacture semiconductor devices using 3D nanosheets and 2D materials, according to an embodiment.
Figure 15:
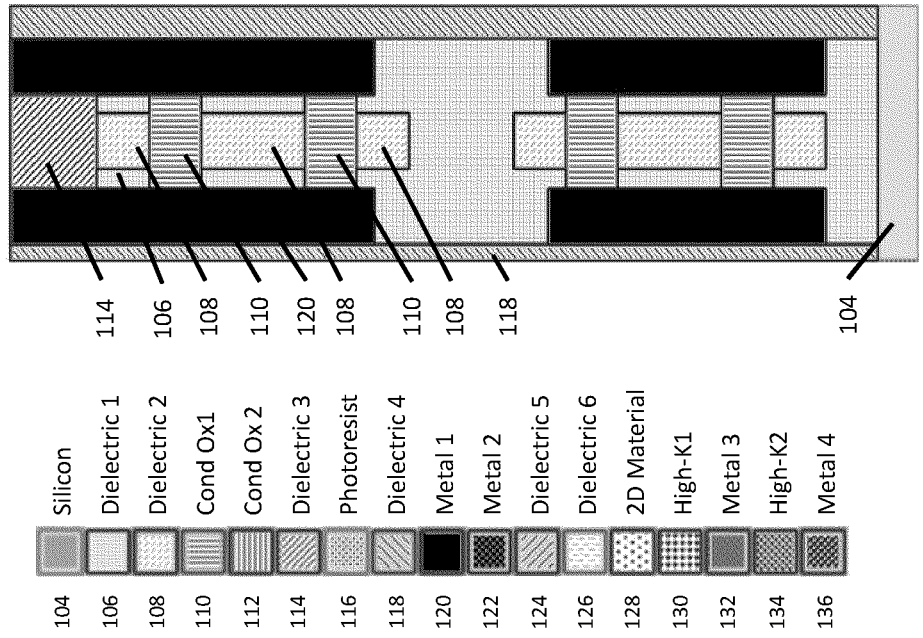
Figure 15:
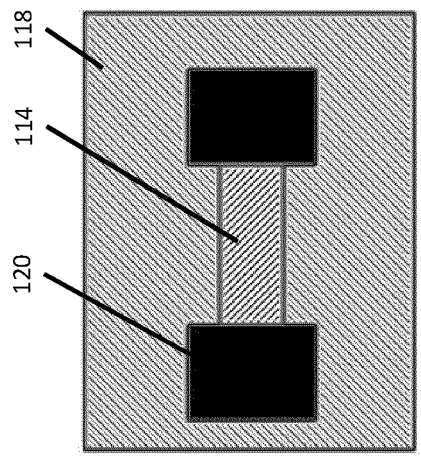
Figure 16:
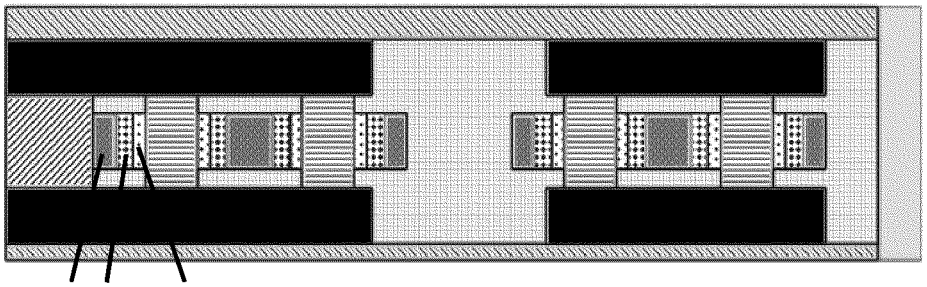
Figure 16:
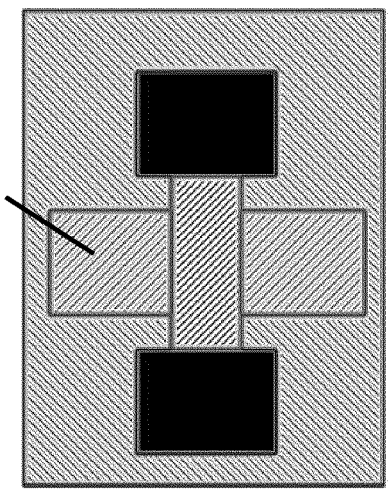
Figure 16:
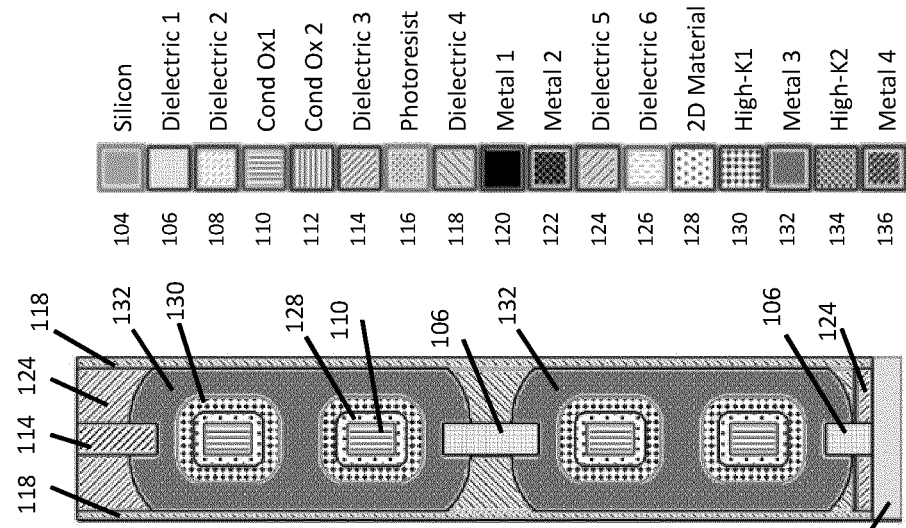
Figure 16:
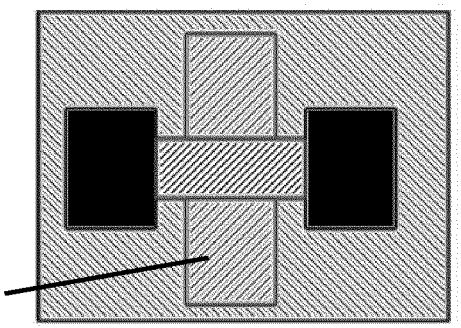

FIGS. 14-16 show various views of a second process flow to manufacture semiconductor devices using 3D nanosheets and 2D materials. Each of the FIGS. 14-16 generally refer to one or more process steps in a process flow, each of which are described in detail in connection with a respective Figure. For the purposes of simplicity and ease of visualization, some reference numbers may be omitted from some Figures. Referring to FIG. 14, illustrated is a top view 1400 and a cross-sectional view 1402 of the stack of layers. At the first stage in the process flow, techniques similar to those described in connection with FIG. 1 can be performed to create the stack of layers shown in the cross-sectional view 1402. The difference between the stack of layers shown in FIG. 14 and the stack of layers shown in FIG. 1 is a second semiconductive-behaving material 110 (shown as "Cond Ox 1" in the legend) is formed in the stack instead of the semiconductive-behaving material 112. The second semiconductive-behaving material 110 can be, for example, a conductive dielectric material (sometimes referred to herein as a "conductive channel" or "conductive oxide"), which may have similar properties to semiconductor materials. Certain materials, when combined with oxygen, may form new materials that exhibit semiconductor properties (e.g., features with the new materials can turn "off" with low off-state leakage current, or can become highly conductive under certain circumstances, etc.). Some examples of N-type conductive oxides include $In_2O_3$, $SnO_2$, InGaZnO, and ZnO. One example of a P-type conductive oxide is SnO. One example of a P-type conductive channel is SnO. The second semiconductive-behaving material 110 can be a different material than the semiconductive-behaving material 112. For example, the semiconductive-behaving material 112 may be an N-type semiconductive material, and the second semiconductive-behaving material 110 may be a P-type semiconductive material.

Referring to FIG. 15, illustrated is a top view 1500 and a cross-sectional view 1502 of the stack of layers. This stage in the process flow shows the formation of source/drain contacts using the second metal material 120 (shown as "Metal 1" in the legend). To form the source/drain contacts, steps similar to those described in connection with FIGS. 2-8 can be performed. However, rather than using the metal material 122, the second metal material 120 can be used. The second metal material 120 can be different than the metal material 122 and may be chosen based on the type of the second semiconductive-behaving material 110. The second metal material 120 or the metal material 122 can be any type of metal material, including gold, platinum, silver, molybdenum, tungsten, or copper, among others.

Referring to FIG. 16, illustrated are top views 1600 and 1606, and cross-sectional views 1602 and 1604 of the next stage in the process flow. At this stage in the process flow, transistor devices may be formed using processes similar to those described in connection with FIGS. 9-13. However, because the second semiconductive-behaving material 110 used in this process flow is different from the semiconductive-behaving material 112 used in the process flow of FIGS. 1-13, a second high-k dielectric material 130 (shown as "High-K1" in the legend) and a second gate metal 132 (shown as "Metal 3" in the legend) can be used. The second high-k dielectric material 130 can be any type of material with a relatively high dielectric constant and may be deposited at a predetermined thickness to achieve a desired capacitance. In some implementations, the second high-k dielectric material 130 can be selectively deposited or grown, such that the second high-k dielectric 130 is deposited only on the 2D material 128. The second high-k dielectric material 130 may be deposited using any suitable material deposition technique, including but not limited to ALD, CVD, PVD, or PECVD, among others. The second high-k dielectric material 130 may be selected based on the type of the second semiconductive-behaving material 110. The second gate metal 132 can be any type of metal that is suitable to act as a gate contact for the transistor structures formed in this process flow. The second gate metal can be any type of metal material, including gold, platinum, silver, molybdenum, tungsten, or copper, among others. The second gate metal 130 may be selected based on the type of the second semiconductive behaving material 110.

Figure 17:
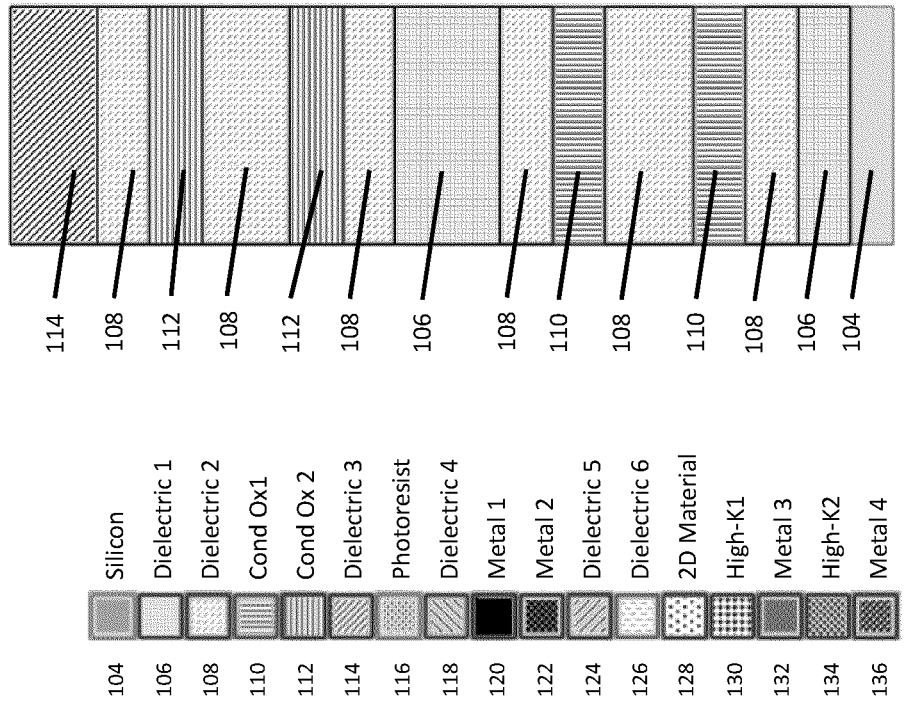
FIGS. 17-22 show various views of a third process flow to manufacture semiconductor devices using 3D nanosheets and 2D materials, according to an embodiment.
Figure 17:
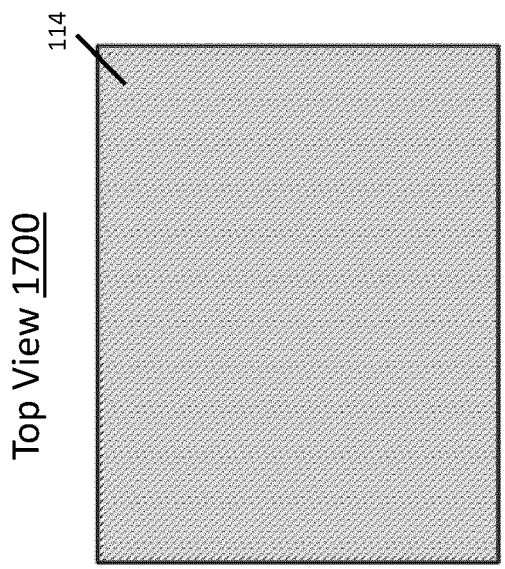

FIGS. 17-22 show various views of a third process flow to manufacture semiconductor devices using 3D nanosheets and 2D materials, according to an embodiment. Each of the FIGS. 17-22 generally refer to one or more process steps in a process flow, each of which are described in detail in connection with a respective Figure. For the purposes of simplicity and ease of visualization, some reference numbers may be omitted from some Figures. Referring to FIG. 17, illustrated is a top view 1700 and a cross-sectional view 1702 of the stack of layers. At the first stage in the process flow, techniques similar to those described in connection with FIG. 1 or FIG. 14 can be performed to create the stack of layers shown in the cross-sectional view 1702. The difference between the stack of layers shown in FIG. 17 and the stack of layers shown in FIG. 1 and FIG. 14 are two different types of semiconductive-behaving material are used: the second semiconductive-behaving material 110 (shown as "Cond Ox 1" in the legend) formed as the first and second layers of the semiconductive-behaving material in the stack of layers and the semiconductive behaving material 112 (shown as "Cond Ox 2" in the legend) formed for the third and fourth layers of the semiconductive behaving material 112. Any suitable material deposition techniques may be used to form the stack of layers.

Figure 18:
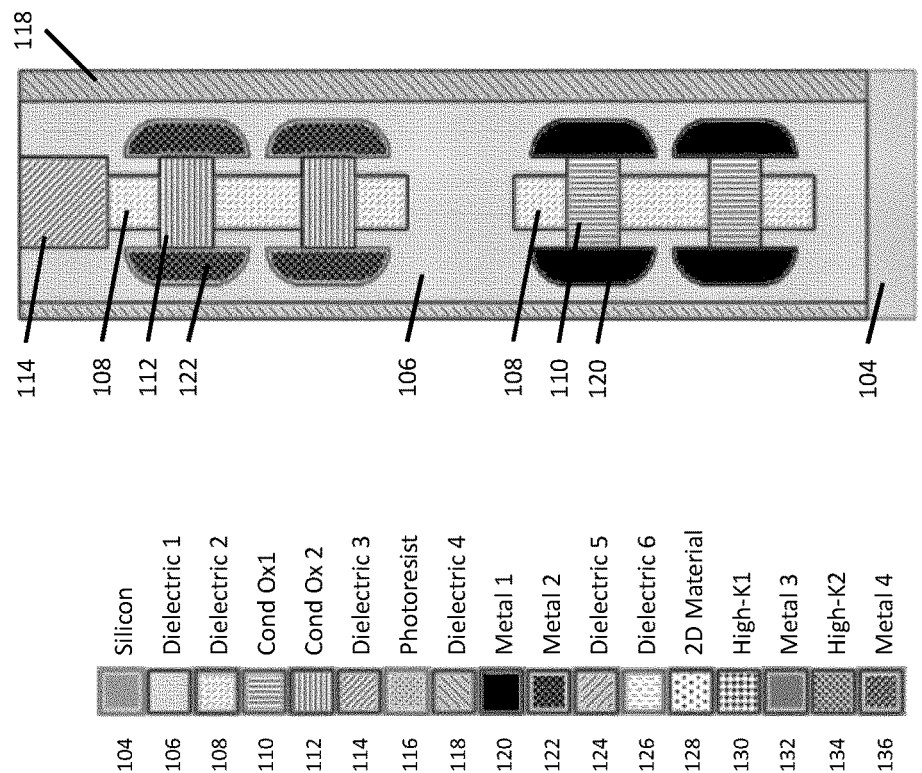
Figure 18:
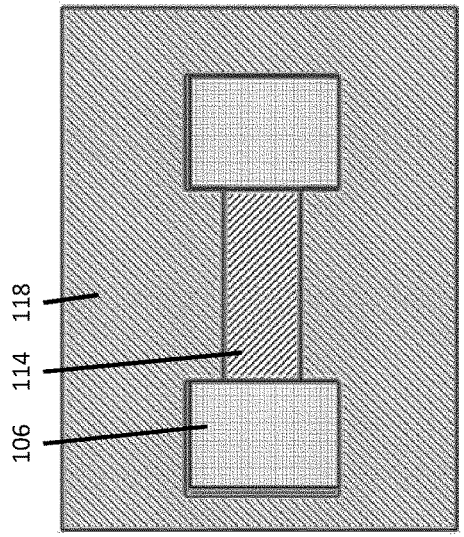

Referring to FIG. 18, illustrated is a top view 1800 and a cross-sectional view 1802 of the stack of layers. This stage in the process flow shows the formation of source/drain contacts using the second metal material 120 (shown as "Metal 1" in the legend). To form the source/drain contacts, steps similar to those described in connection with FIGS. 2-8 can be performed. However, rather than performing a material deposition technique as described in connection with FIGS. 7 and 8, the metal material 122 and the second metal material 120 can be formed on the semiconductive-behaving material 112 and the second semiconductive-behaving material 110, respectively, using selective deposition techniques. In some implementations, the metal material 122 and the second metal material 120 can be grown on the semiconductive-behaving material 112 and the second semiconductive-behaving material 110, respectively, such that the semiconductive-behaving materials behave as seed materials. In some implementations, the processes described in connection with FIGS. 7 and 8 can be used, and the metal material 122 and the second metal material 120 can be deposited and etched (with corresponding material deposition of the first dielectric material 106), such that an isolated source/drain contact for each layer of the semiconductive-behaving materials 110 and 112. After selectively growing or depositing the metal material 122 or the second metal material 120, the first dielectric material 106 can be deposited to fill any remaining gaps in the openings of the fourth dielectric material 118 used to form the source/drain contacts.

Figure 19:
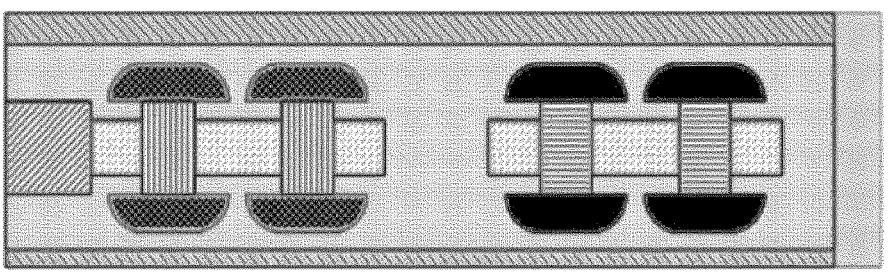
Figure 19:
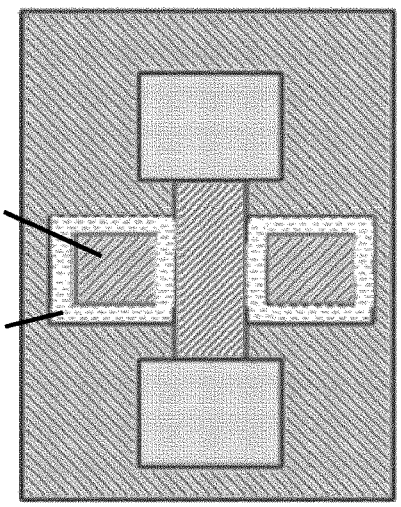
Figure 19:
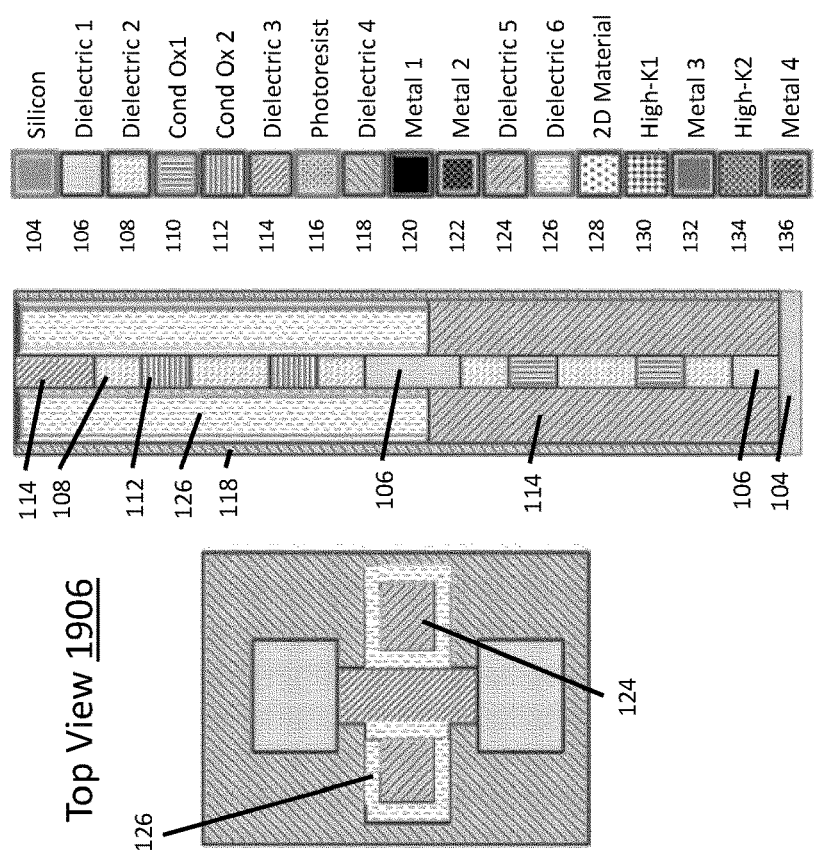

Referring to FIG. 19, illustrated are top views 1900 and 1906 and cross-sectional views 1902 and 1904 of the next stage in the process flow. At this stage in the process flow, steps similar to those described in FIGS. 9 and 10 can be performed, except that because different gate materials will be formed for each type of semiconductive-behaving material, the semiconductive-behaving material 112 and its adjacent layers are protected using a layer of the sixth dielectric material 126 (shown as "Dielectric 6" in the legend). To do so, the fifth dielectric material 124 can be deposited in the gate openings, as described in connection with FIG. 10. Then, the fifth dielectric material 124 can be directionally etched to be level above half-way through the stack of materials, as shown. Then, a layer of the sixth dielectric material 126 can be deposited in the gate openings, using any suitable material deposition technique (e.g., ALD, CVD, PVD, PECVD, etc.). The sixth dielectric material 126 can then be directionally etched to expose the fifth dielectric material 124 in the gate openings, as shown in the top views 1900 and 1906.

Figure 20:
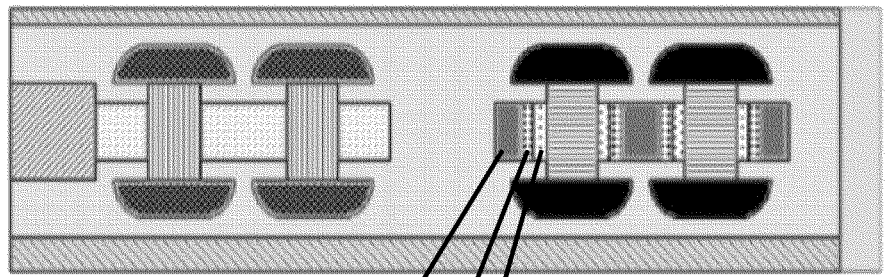
Figure 20:
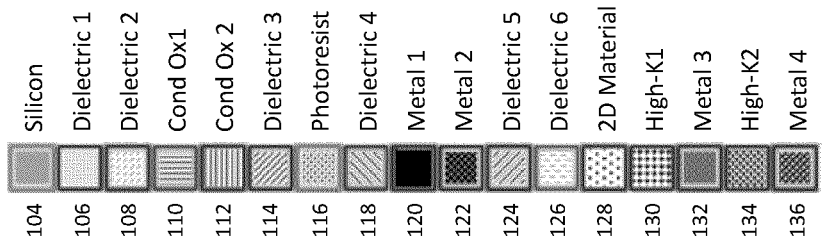
Figure 20:
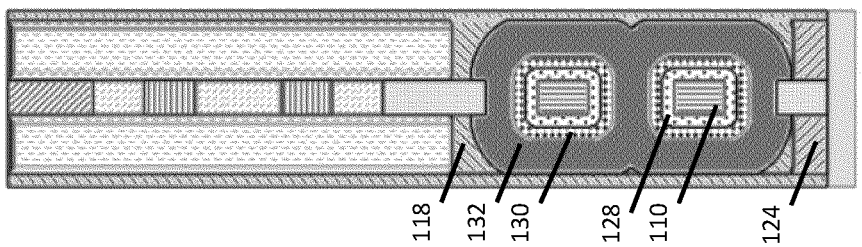

Referring to FIG. 20, illustrated are top views 2000 and 2006 and cross-sectional views 2002 and 2004 of the next stage in the process flow. At this stage in the process flow, steps similar to those described in connection with FIGS. 11-13 and can be performed to form the 2D material 128 on the second semiconductive-behaving material 120, a layer of the second high-k dielectric material 130 on the layer of the 2D material 128, and a second gate metal 132 on the second high-k dielectric material 130, as shown in the cross-sectional views 2002 and 2004. However, as shown, the semiconductive-behaving material 112 is protected from the material formation techniques used to construct the lower two transistors by the sixth dielectric material 126.

Figure 21:
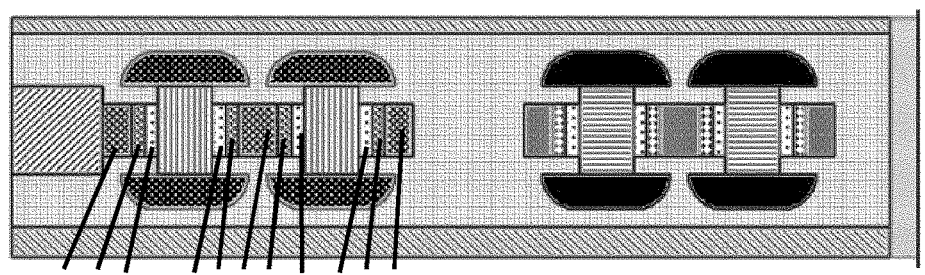
Figure 21:
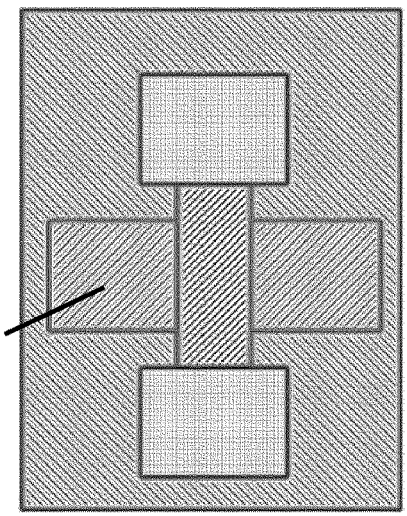
Figure 21:
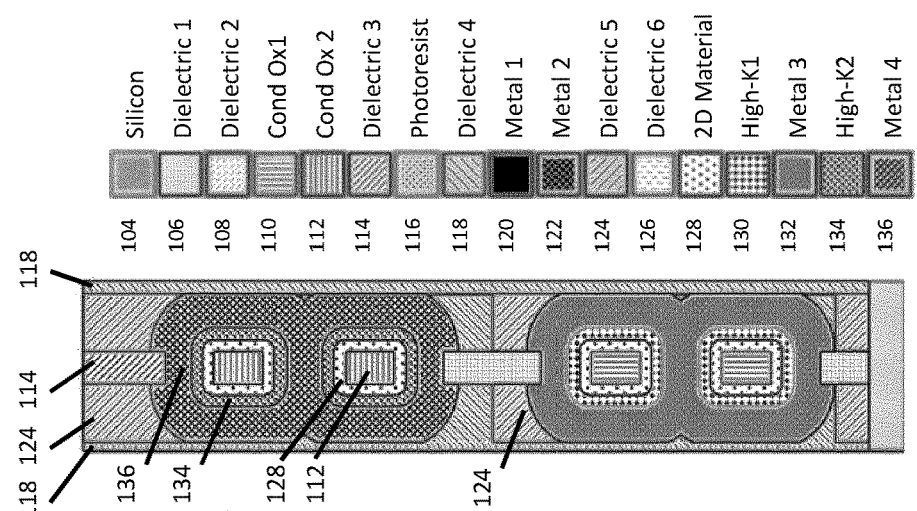
Figure 21:
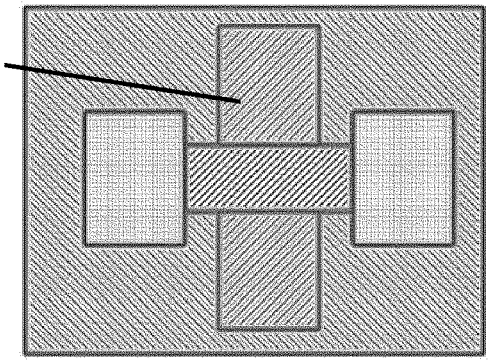

Referring to FIG. 21, illustrated are top views 2100 and 2106 and cross-sectional views 2102 and 2104 of the next stage in the process flow. At this stage in the process flow, the sixth dielectric material 126 can be selectively etched and removed from the gate openings, thereby exposing the semiconductive-behaving material 112 in the gate openings. A layer of the fifth dielectric material 124 can be deposited in the gate openings on top of the second gate metal 132 and subsequently etched to about halfway in the stack of layers, as shown in the cross-sectional view 2104. Then, processes similar to those described in connection with FIGS. 11-13, 16, and 20 can be performed to form the 2D material 128 on the semiconductive-behaving material 112. A layer of the high-k dielectric material 124 can then be formed on the 2D material, and a gate metal 132 can be formed on the high-k dielectric material 124. Any remaining gaps at the top of the device can be deposit-filled with the fifth dielectric material 124, and a CMP process can be performed.

Figure 22:
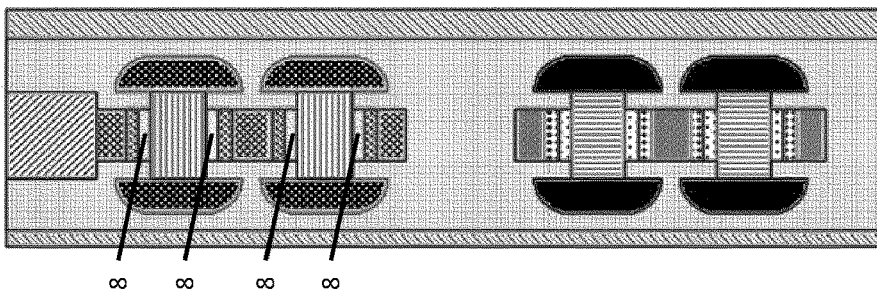
Figure 22:
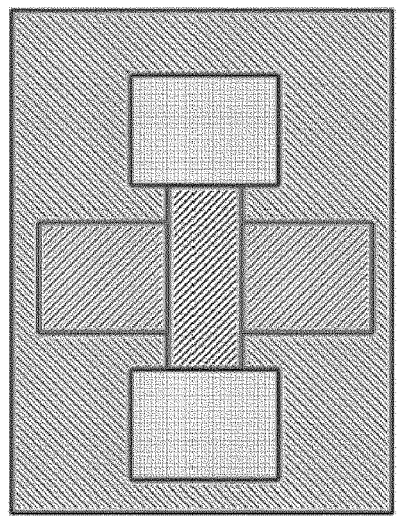
Figure 22:
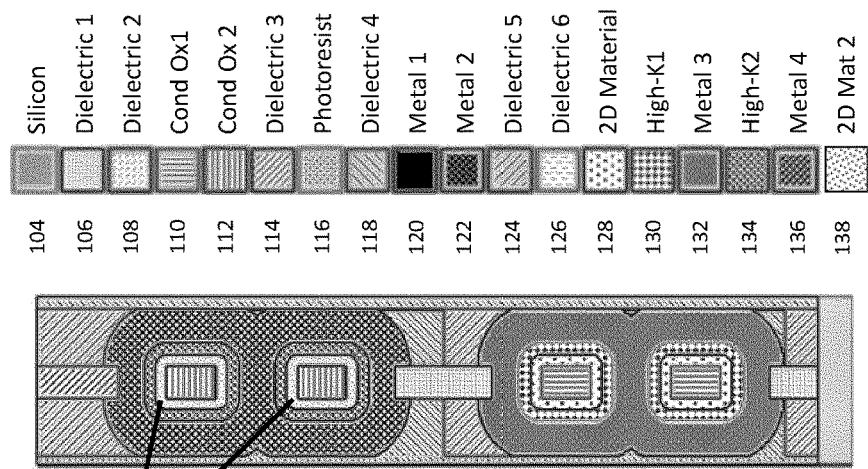

[0054] Referring to FIG. 22, illustrated are top views 2200 and 2206 and cross-sectional views 2202 and 2204 of an alternative process flow to that described in connection with FIG. 21. In this alternative process flow, steps similar to those processes similar to those described in connection with FIGS. 11-13, 16, and 20 can be performed. However, rather than forming the 2D material 128 on the semiconductive-behaving material 112, a second 2D material 138 can be selectively formed on the semiconductive-behaving material 112, as shown in the cross-sectional views 2102 and 2104. The second 2D material 138 can be any type of TMD material, and may include $WS_2$, $WSe_2$, $WTe_2$, $MoS_2$, $MoSe_2$, $MoTe_2$, $HfS_2$, $ZrS_2$, $TiS_2$, GaSe, InSe, InGaZrO, or phosphorene, among others. The second 2D material 138 may be selected based on the type of the semiconductive-behaving material 128. Using these alternative process steps allows for different 2D materials to be deposited on each of the semiconductive-behaving material 112 and the second semiconductive behaving material. After forming the second 2D material, a layer of the high-k dielectric material 124 can then be formed on the second 2D material 138, and a gate metal 132 can be formed on the high-k dielectric material 124. Any remaining gaps at the top of the device can be deposit-filled with the fifth dielectric material 124, and a CMP process can be performed.

Figure 23:
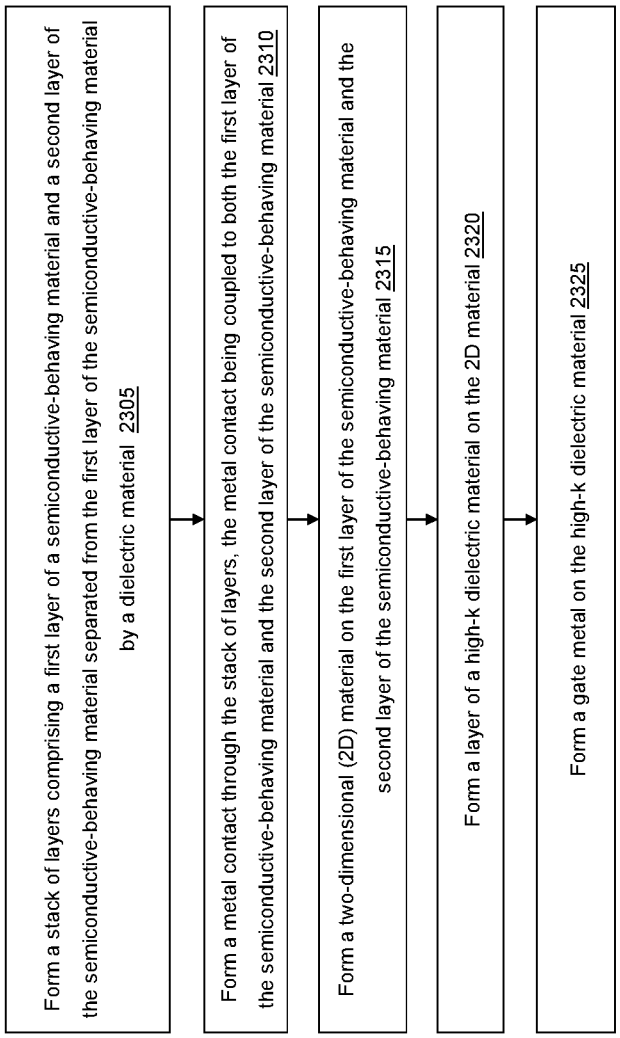
FIG. 23 shows flow a diagram of an example method for fabricating devices using the process flows described in connection with FIGS. 1-22, according to an embodiment.

Referring to FIG. 23, illustrated is a flow diagram of a method 2300 for fabricating semiconductor devices. The method 2300 may include steps 2305-2325. However, other embodiments may include additional or alternative steps, or may omit one or more steps altogether.

Referring to step 2305, the method includes forming a stack of layers. The stack of layers can be formed on a base layer (e.g., the base layer 104). The stack of layers can include a first layer of a semiconductive-behaving material (e.g., the semiconductive-behaving material 112 or the second semiconductive-behaving material 110) separated from the base layer by a first layer of a first dielectric material (e.g., the first dielectric material 106) and a first layer of a second dielectric material (e.g., the second dielectric material 108). The stack of layers can include a second layer of the semiconductive-behaving material separated from the first layer of the semiconductive-behaving material by a second layer of the second dielectric material; and a second layer of the second dielectric material formed on the second layer of the semiconductive-behaving material. To form the stack of layers, processes similar to those described in connection with FIG. 1, 14, or 17 can be performed.

At step 2310, the method 2300 includes forming a metal contact (e.g., the metal material 122 or the metal material 120) through the stack of layers. The metal contact can be coupled to both the first layer of the semiconductive-behaving material and the second layer of the semiconductive-behaving material. To form the metal contacts, process steps similar to those described in connection with FIG. 2-8, 15, or 18 can be performed. The metal contacts may be formed using selective deposition techniques.

At step 2315, the method 2300 includes forming a 2D material (e.g., the 2D material 128 or the second 2D material 128) on the first layer of the semiconductive-behaving material and the second layer of the semiconductive-behaving material. To do so, process steps similar to those described in connection with FIG. 11, 16, 20-21, or 22 can be performed. In some implementations, the 2D material may be selected based on the type of the semiconductive-behaving material.

At step 2320, the method 2300 includes forming a layer of a high-k dielectric material (e.g., the high-k dielectric material 130 or the second high-k dielectric material 134) on the 2D material. To form the high-k dielectric material on the 2D material, process steps similar to those described in connection with FIG. 12, 16, or 21-22 can be performed. In some implementations, the type of the 2D material can be selected based on the type of the semiconductive behaving material.

At step 2325, the method 2300 includes forming a gate metal (e.g., the gate metal 136 or the second gate metal 132) on the high-k dielectric material. To form the gate metal on the high-k dielectric material, the process steps described in connection with FIG. 13, 16, or 20-22 can be performed. Then, after forming the gate metal, any remaining gaps at the top of the device can be deposit-filled with a dielectric material (e.g., the fifth dielectric material 124). The gate metal can be any type of conductive material and can behave as a gate electrode for the transistor structures formed using the present techniques. The metal material formed in prior process steps can behave as a source or drain electrode for the transistor devices formed using this process flow.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method, comprising:
    forming a stack of layers comprising:
        a first layer of a semiconductive-behaving material; and
        a second layer of the semiconductive-behaving material separated from the first layer of the semiconductive-behaving material by a dielectric material;
    selectively forming a metal contact on both the first layer of the semiconductive-behaving material and the second layer of the semiconductive-behaving material;
    forming a two-dimensional (2D) material on the first layer of the semiconductive-behaving material;
    forming the 2D material on the second layer of the semiconductive-behaving material;
    forming a high-k dielectric material on the 2D material on the first layer of the semiconductive-behaving material;
    forming the high-k dielectric material on the 2D material on the second layer of the semiconductive-behaving material; and
    forming a gate metal on the high-k dielectric material.

2. The method of claim 1, further comprising:
    etching a first opening at a first side of the stack of layers and a second opening at the second side of the stack of layers; and
    recessing the dielectric material via the first opening and the second opening to create one or more recessed openings.

3. The method of claim 2, wherein forming the metal contact further comprises:
    forming a second dielectric material in the first opening, the second opening, and the one or more recessed openings; and
    replacing a portion of the second dielectric material with the metal contact.

4. The method of claim 1, wherein the semiconductive-behaving material is one of an n-type material or a p-type material.

5. The method of claim 1, further comprising:
    forming a second stack of layers comprising:
        a third layer of a second semiconductive-behaving material; and
        a fourth layer of the second semiconductive-behaving material separated from the third layer of the second semiconductive-behaving material by a dielectric material;
    forming a second metal contact coupled to both the third layer of the second semiconductive-behaving material and the fourth layer of the second semiconductive-behaving material;
    forming a second 2D material on the third layer of the second semiconductive-behaving material;
    forming the second 2D material on the fourth second layer of the second semiconductive-behaving material;
    forming a second high-k dielectric material on the second 2D material; and
    forming a second gate metal on the second high-k dielectric material.

6. The method of claim 5, wherein:
    the second semiconductive-behaving material and the semiconductive-behaving material are the same material;
    the second metal contact and the metal contact are the same material;
    the second 2D material and the 2D material are the same material; and
    the second gate metal and the gate metal are the same material.

7. The method of claim 5, wherein:
    the second semiconductive-behaving material and the semiconductive-behaving material are different materials;
    the second metal contact and the metal contact are different materials;

the second 2D material and the 2D material are different materials; and the second gate metal and the gate metal are different materials.

8. The method of claim 1, wherein forming the 2D material comprises selectively depositing the 2D material on the semiconductive-behaving material.

9. The method of claim 1, wherein forming the high-k dielectric material comprises selectively depositing the high-k dielectric material on the 2D material.

10. A device, comprising:
a transistor structure comprising:
  a layer of a semiconductive-behaving material partially surrounded by a two-dimensional (2D) material, a high-k dielectric material, and a gate metal;
  a first metal contact coupled to a first surface of the semiconductive-behaving material, and electrically isolated from the 2D material, the high-k dielectric material, and the gate metal; and
  a second metal contact coupled to a second surface of the semiconductive-behaving material, and electrically isolated from the 2D material, the high-k dielectric material, and the gate metal, the first and second metal contacts electrically isolated by a dielectric layer disposed between the first metal contact and the metal gate, the 2D material and the high-k dielectric material, the dielectric layer extending at least partially around the first and second metal contacts.

11. The device of claim 10, further comprising a second transistor structure formed above the transistor structure, the second transistor structure comprising:
  a layer of a second semiconductive-behaving material partially surrounded by a second 2D material, a second high-k dielectric material, and a second gate metal;
  a third metal contact coupled to a first surface of the second semiconductive-behaving material, and electrically isolated from the second 2D material, the second high-k dielectric material, and the second gate metal; and
  a fourth metal contact coupled to a second surface of the second semiconductive-behaving material, and electrically isolated from the second 2D material, the second high-k dielectric material, and the second gate metal.

12. The device of claim 11, wherein:
the second semiconductive-behaving material and the semiconductive-behaving material are the same material;
the third metal contact and the first metal contact are the same material;
the second 2D material and the 2D material are the same material;
the second high-k dielectric material and the high-k dielectric material are the same material; and
the second gate metal and the gate metal are the same material.

13. The device of claim 11, wherein:
the second semiconductive-behaving material and the semiconductive-behaving material are different materials;
the third metal contact and the first metal contact are different materials;
the second 2D material and the 2D material are different materials;
the second high-k dielectric material and the high-k dielectric material are different materials; and
the second gate metal and the gate metal are different materials.

14. The device of claim 11, wherein the second metal contact is coupled to the metal contact.

15. The device of claim 11, wherein the second gate metal is coupled to the gate metal.

16. The device of claim 10, wherein the transistor structure further comprises:
  a second layer of the semiconductive-behaving material partially surrounded by the 2D material, the high-k dielectric material, and the gate metal,
  wherein the first metal contact is coupled to a first surface of the second layer of the semiconductive-behaving material, and electrically isolated from the 2D material, the high-k dielectric material, and the gate metal, and
  the second metal contact is coupled to a second surface of the second layer of the semiconductive-behaving material, and electrically isolated from the 2D material, the high-k dielectric material, and the gate metal.

17. A transistor structure comprising:
a source metal;
a drain metal;
a channel of a semiconductive behaving material extending between the source metal and the drain metal;
a two-dimensional (2D) material partially around the channel;
a high-k dielectric at least partially around the 2D material; and
a gate metal at least partially around the high k-dielectric,
wherein the 2D material, high-k dielectric, and gate metal are isolated from the source metal and drain metal by a dielectric.

18. The transistor structure of claim 17, further comprising a second channel of the semiconductive-behaving material extending between the source metal and the drain metal,
wherein the 2D material is partially around the second channel,
the high-k dielectric is at least partially around the 2D material, and
the gate metal is at least partially around the high k-dielectric.

19. The transistor structure of claim 17, further comprising a second channel of the semiconductive-behaving material extending between a second source metal and a second drain metal,
wherein the 2D material is partially around the second channel,
the high-k dielectric is partially around the 2D material, and
the gate metal is partially around the high k-dielectric.

* * * * *